(12) United States Patent
Fujiwara et al.

(10) Patent No.: US 12,029,023 B2
(45) Date of Patent: *Jul. 2, 2024

(54) MEMORY ARRAY CIRCUIT AND METHOD OF MANUFACTURING SAME

(71) Applicant: TAIWAN SEMICONDUCTOR MANUFACTURING COMPANY, LTD., Hsinchu (TW)

(72) Inventors: Hidehiro Fujiwara, Hsinchu (TW); Chih-Yu Lin, Hsinchu (TW); Hsien-Yu Pan, Hsinchu (TW); Yasutoshi Okuno, Hsinchu (TW); Yen-Huei Chen, Hsinchu (TW); Hung-Jen Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/304,301

(22) Filed: Apr. 20, 2023

(65) Prior Publication Data

US 2023/0301049 A1 Sep. 21, 2023

Related U.S. Application Data

(60) Continuation of application No. 17/325,641, filed on May 20, 2021, now Pat. No. 11,637,108, which is a
(Continued)

(51) Int. Cl.
*H10B 10/00* (2023.01)
*G06F 30/392* (2020.01)
(Continued)

(52) U.S. Cl.
CPC ........... *H10B 10/12* (2023.02); *G06F 30/392* (2020.01); *H01L 23/5226* (2013.01); *H01L 23/5286* (2013.01); *H01L 27/0207* (2013.01)

(58) Field of Classification Search
CPC ........ H10B 10/12; H10B 43/00; H10B 43/30; G06F 30/392; H01L 23/5226;
(Continued)

(56) References Cited

U.S. PATENT DOCUMENTS 11,018,142 B2 5/2021 Fujiwara et al.
11,637,108 B2 * 4/2023 Fujiwara ............. H01L 23/5226
257/401

(Continued)

FOREIGN PATENT DOCUMENTS

TW 201405558 2/2014

OTHER PUBLICATIONS

Office Action dated May 1, 2020 from corresponding application No. TW 108124896.
(Continued)

*Primary Examiner* — Caleen O Sullivan
(74) *Attorney, Agent, or Firm* — Hauptman Ham, LLP

(57) ABSTRACT

A method of forming a memory circuit includes generating a layout design of the memory circuit, and manufacturing the memory circuit based on the layout design. The generating of the layout design includes generating a first active region layout pattern corresponding to fabricating a first active region of a first pull down transistor, generating a second active region layout pattern corresponding to fabricating a second active region of a first pass gate transistor, and generating a first metal contact layout pattern corresponding to fabricating a first metal contact. The first metal contact layout pattern overlaps the cell boundary of the memory circuit and the first active region layout pattern. The first metal contact electrically coupled to a source of the first pull down transistor. The memory circuit being a four transistor (4T) memory cell including a first and second pass gate transistor, and a first and second pull down transistor.

20 Claims, 17 Drawing Sheets

Related U.S. Application Data division of application No. 16/457,553, filed on Jun. 28, 2019, now Pat. No. 11,018,142.

(60) Provisional application No. 62/698,665, filed on Jul. 16, 2018.

(51) Int. Cl.
  *H01L 23/522* (2006.01)
  *H01L 23/528* (2006.01)
  *H01L 27/02* (2006.01)

(58) Field of Classification Search
  CPC . H01L 23/5286; H01L 27/0207; H01L 27/02; G11C 11/413; G11C 11/412
  USPC ........................................................ 257/401
  See application file for complete search history.

(56) References Cited

U.S. PATENT DOCUMENTS

| | | |
|---|---|---|
| 2003/0122172 A1 | 7/2003 | Ferrant et al. |
| 2004/0032761 A1 | 2/2004 | Wong |
| 2005/0063238 A1 | 3/2005 | Nambu et al. |
| 2011/0291199 A1 | 12/2011 | Thomas et al. |
| 2012/0086082 A1 | 4/2012 | Malinge et al. |
| 2014/0133218 A1 | 5/2014 | Liaw |
| 2015/0248521 A1 | 9/2015 | Liaw |
| 2018/0043239 A1 | 2/2018 | Stoller |

OTHER PUBLICATIONS

Notice of Allowance dated Oct. 21, 2021 from corresponding application No. KR 10-2021-0098679 (pp. 1-6). English translation attached on p. 1.

\* cited by examiner

MEMORY ARRAY CIRCUIT AND METHOD OF MANUFACTURING SAME

PRIORITY CLAIM AND CROSS-REFERENCE

The present application is a continuation of U.S. application Ser. No. 17/325,641 filed May 20, 2021, now U.S. Pat. No. 11,637,108, issued Apr. 25, 2023, which is a divisional of U.S. application Ser. No. 16/457,553 filed Jun. 28, 2019, now U.S. Pat. No. 11,018,142, issued May 25, 2021, which claims the benefit of U.S. Provisional Application No. 62/698,665, filed Jul. 16, 2018, each of which are incorporated herein by reference in their entireties.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
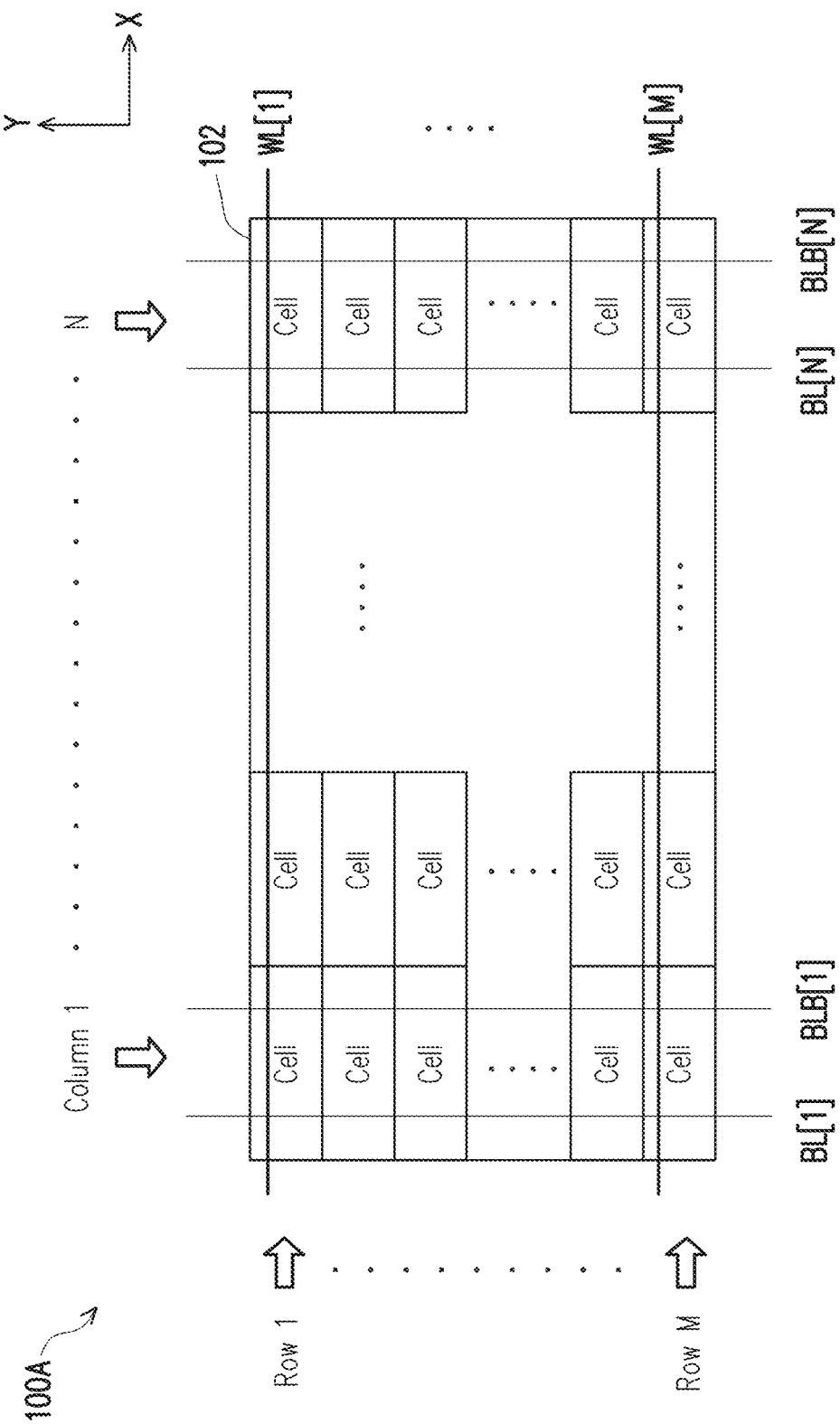
FIG. 1A is a circuit diagram of a memory macro, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory cell includes a first and second pull up transistor, a first and second pass gate transistor and a first metal contact. In some embodiments, the first pass gate transistor, the second pass gate transistor, the first pull up transistor and the second pull up transistor are part of a four transistor (4T) memory cell. In some embodiments, the second pass gate transistor is coupled to the second pull up transistor.

In some embodiments, the first pull up transistor has a first active region extending in a first direction, and is located on a first level. In some embodiments, the first pass gate transistor has a second active region extending in the first direction. In some embodiments, the second active region is located on the first level, and is separated from the first active region in a second direction different from the first direction. In some embodiments, the second active region is adjacent to the first active region.

In some embodiments, the first metal contact extends in the second direction, and extends from the first active region to the second active region. In some embodiments, the first metal contact is located on a second level different from the first level. In some embodiments, the first metal contact electrically couples a drain of the first pull up transistor to a drain of the first pass gate transistor.

Memory Macro

FIG. 1A is a circuit diagram of a memory macro 100A, in accordance with some embodiments. In the embodiment of FIG. 1, memory macro 100A is a static random access memory (SRAM) macro. SRAM is used for illustration, and other types of memories are within the scope of various embodiments.

Memory macro 100A comprises an array of cells 102 having M rows and N columns, where N is a positive integer corresponding to the number of columns in array of cells 102 and M is a positive integer corresponding to the number of rows in array of cells 102. The rows of cells in array of cells 102 are arranged in a first direction X. The columns of cells in array of cells 102 are arranged in a second direction Y. The second direction Y is different from the first direction X.

In some embodiments, the second direction is perpendicular to the first direction. In some embodiments, array of cells 102 includes one or more single port (SP) SRAM cells. In some embodiments, array of cells 102 includes one or more dual port (DP) SRAM cells. Different types of memory cells in array of cells 102 are within the contemplated scope of the present disclosure.

Memory macro 100A further includes N bit lines BL[1], . . . BL[N] (collectively referred to as "bit line BL") and N bit line bars BLB [1], . . . BLB[N] (collectively referred to as "bit line bar BLB"). Each column 1, . . . , N in array of cells 102 is overlapped by a corresponding bit line BL[1], . . . , BL[N] and a corresponding bit line bar BLB [1], . . . , BLB[N]. Each bit line BL or bit line bar BLB extends in the second direction Y and over a column of cells (e.g., column 1, . . . , N).

Memory macro 100A further includes M word lines WL[1], . . . WL[M] (collectively referred to as "word line WL"). Each row 1, . . . , M in array of cells 102 is overlapped by a corresponding word line WL[1], . . . , WL[M]. Each word line WL extends in the first direction X and over a corresponding row of cells (e.g., row 1, . . . , M).

Different configurations of memory macro 100A are within the contemplated scope of the present disclosure.

A Memory Cell

Figure 1B:
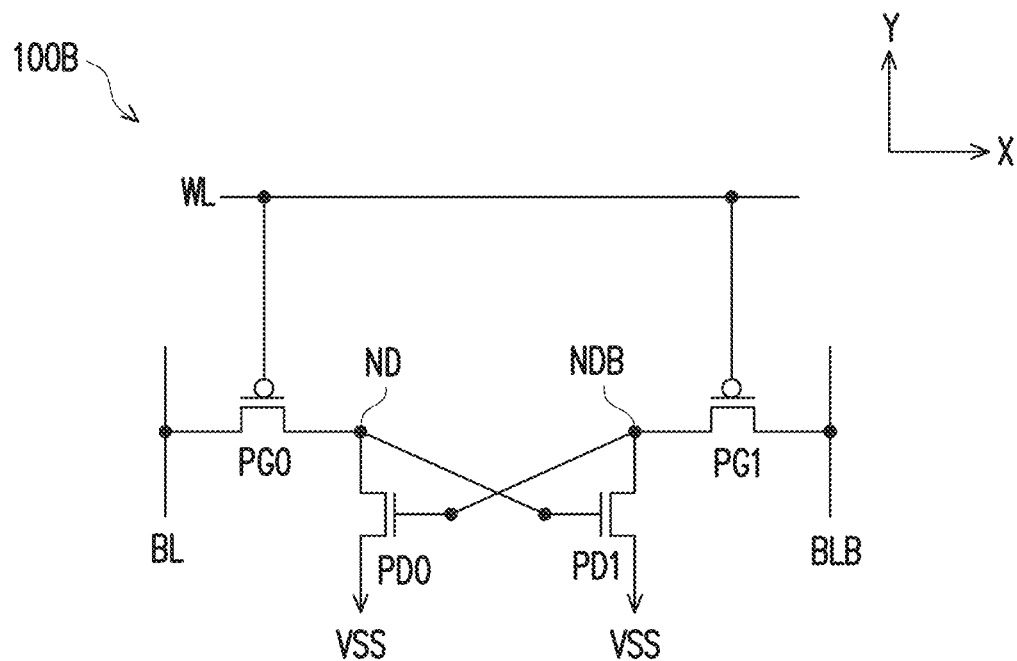
FIG. 1B is a circuit diagram of a memory cell, in accordance with some embodiments.

FIG. 1B is a circuit diagram of a memory cell 100B useable in FIG. 1A, in accordance with some embodiments.

Memory cell 100B is usable as one or more memory cells in memory macro 100A of FIG. 1A.

Memory cell 100B is a four transistor (4T) single port (SP) SRAM memory cell used for illustration. In some embodiments, memory cell 100B includes a number of transistors other than four. Other types of memory are within the scope of various embodiments.

Memory cell 100B comprises two P-type metal oxide semiconductor (PMOS) transistors PG0 and PG1, and two N-type metal oxide semiconductor (NMOS) transistors PD0 and PD1. PMOS transistors PG0 and PG1 are configured as pass-gate transistors, and NMOS transistors PD0 and PD1 are configured as pull-down transistors.

A drain terminal of NMOS transistor PD0, a gate terminal of NMOS transistor PD1, and a source terminal of PMOS transistor PG0 are coupled together at a node configured as a storage node ND. A drain terminal of NMOS transistor PD1, a gate terminal of NMOS transistor PD0, and a source terminal of PMOS transistor PG1 are coupled together at a node configured as a storage node NDB.

A source terminal of each of NMOS transistors PD0 and PD1 is configured as a supply reference voltage node (not labelled) having a supply reference voltage VSS. The source terminal of each of NMOS transistors PD0 and PD1 is also coupled to supply reference voltage VSS.

A word line WL is coupled with a gate terminal of each of PMOS transistors PG0 and PG1. Word line WL is also called a write control line because PMOS transistors PG0 and PG1 are configured to be controlled by a signal on word line WL in order to transfer data between bit lines BL, BLB and corresponding nodes ND, NDB.

A drain terminal of PMOS transistor PG0 is coupled to a bit line BL. A drain terminal of PMOS transistor PG1 is coupled to a bit line BLB. Bit lines BL and BLB are configured as both data input and output for memory cell 100B. In some embodiments, in a write operation, applying a logical value to a first bit line BL and the opposite logical value to the other bit line BLB enables writing the logical values on the bit lines to memory cell 100B. Each of bit lines BL and BLB is called a data line because the data carried on bit lines BL and BLB are written to and read from corresponding nodes ND and NDB.

Different configurations of memory cell 100B are within the contemplated scope of the present disclosure. For example, source or drain terminals of PMOS transistor PG0, PMOS transistor PG1, NMOS transistor PD0, or NMOS transistor PD1 can be swapped for corresponding drain or source terminals of PMOS transistor PG0, PMOS transistor PG1, NMOS transistor PD0, or NMOS transistor PD1, and vice versa.

Another Memory Cell

Figure 1C:
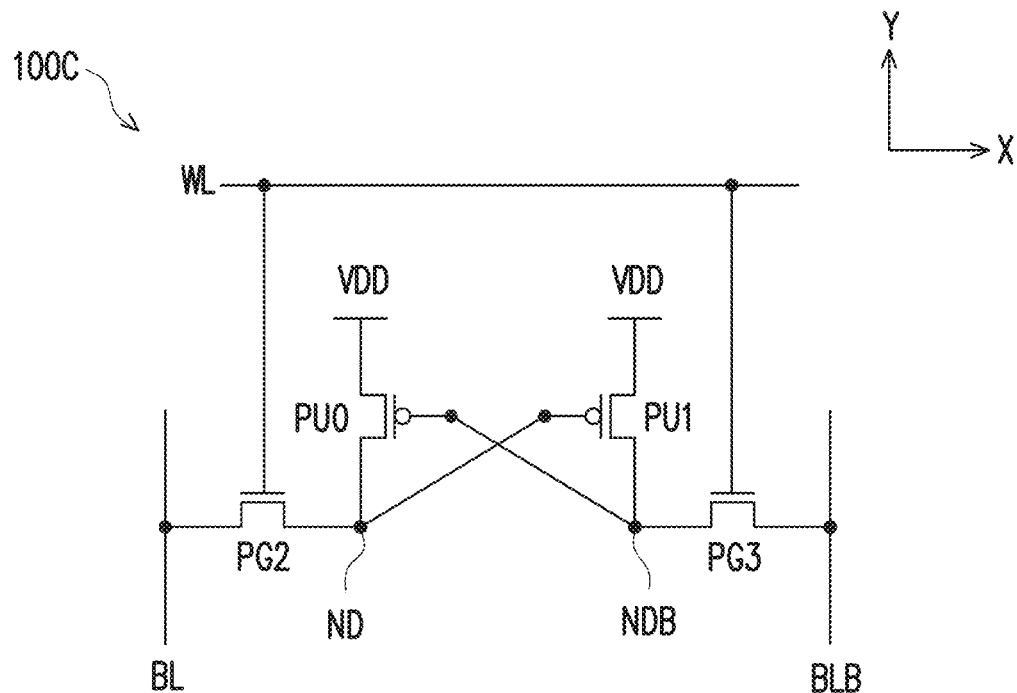
FIG. 1C is a circuit diagram of a memory cell, in accordance with some embodiments.

FIG. 1C is a circuit diagram of a memory cell 100C useable in FIG. 1A, in accordance with some embodiments.

Memory cell 100C is usable as one or more memory cells in memory macro 100A of FIG. 1A.

Memory cell 100C is a 4T SP SRAM memory cell used for illustration. In some embodiments, memory cell 100C includes a number of transistors other than four. Other types of memory are within the scope of various embodiments.

Memory cell 100C comprises two PMOS transistors PU0 and PU1, and two NMOS transistors PG2 and PG3. NMOS transistors PG2 and PG3 are configured as pass-gate transistors, and PMOS transistors PU0 and PU1 are configured as pull-up transistors.

A drain terminal of PMOS transistor PU0, a gate terminal of PMOS transistor PU1, and a source terminal of NMOS transistor PG2 are coupled together at a node configured as storage node ND. A drain terminal of PMOS transistor PU1, a gate terminal of PMOS transistor PU0, and a source terminal of NMOS transistor PG3 are coupled together at a node configured as storage node NDB.

A source terminal of each of PMOS transistors PU0 and PU1 is configured as a supply voltage node (not labelled) having a supply voltage VDD. The source terminal of each of PMOS transistors PU0 and PU1 is also coupled to supply voltage VDD.

A word line WL is coupled with a gate terminal of each of NMOS transistors PG2 and PG3. NMOS transistors PG2 and PG3 are configured to be controlled by a signal on word line WL in order to transfer data between bit lines BL, BLB and corresponding nodes ND, NDB.

A drain terminal of NMOS transistor PG2 is coupled to a bit line BL. A drain terminal of NMOS transistor PG3 is coupled to a bit line BLB. Bit lines BL and BLB are configured as both data input and output for memory cell 100C. In some embodiments, in a write operation, applying a logical value to a bit line BL and the opposite logical value to the other bit line BLB enables writing the logical values on the bit lines to memory cell 100C. Each of bit lines BL and BLB is called a data line because the data carried on bit lines BL and BLB are written to and read from corresponding nodes ND and NDB.

Different configurations of memory cell 100C are within the contemplated scope of the present disclosure. For example, source or drain terminals of NMOS transistor PG2, NMOS transistor PG3, PMOS transistor PU0 or PMOS transistor PU1 can be swapped for corresponding drain or source terminals of NMOS transistor PG2, NMOS transistor PG3, PMOS transistor PU0 or PMOS transistor PU1, and vice versa.

Layout Design

Figure 2A:
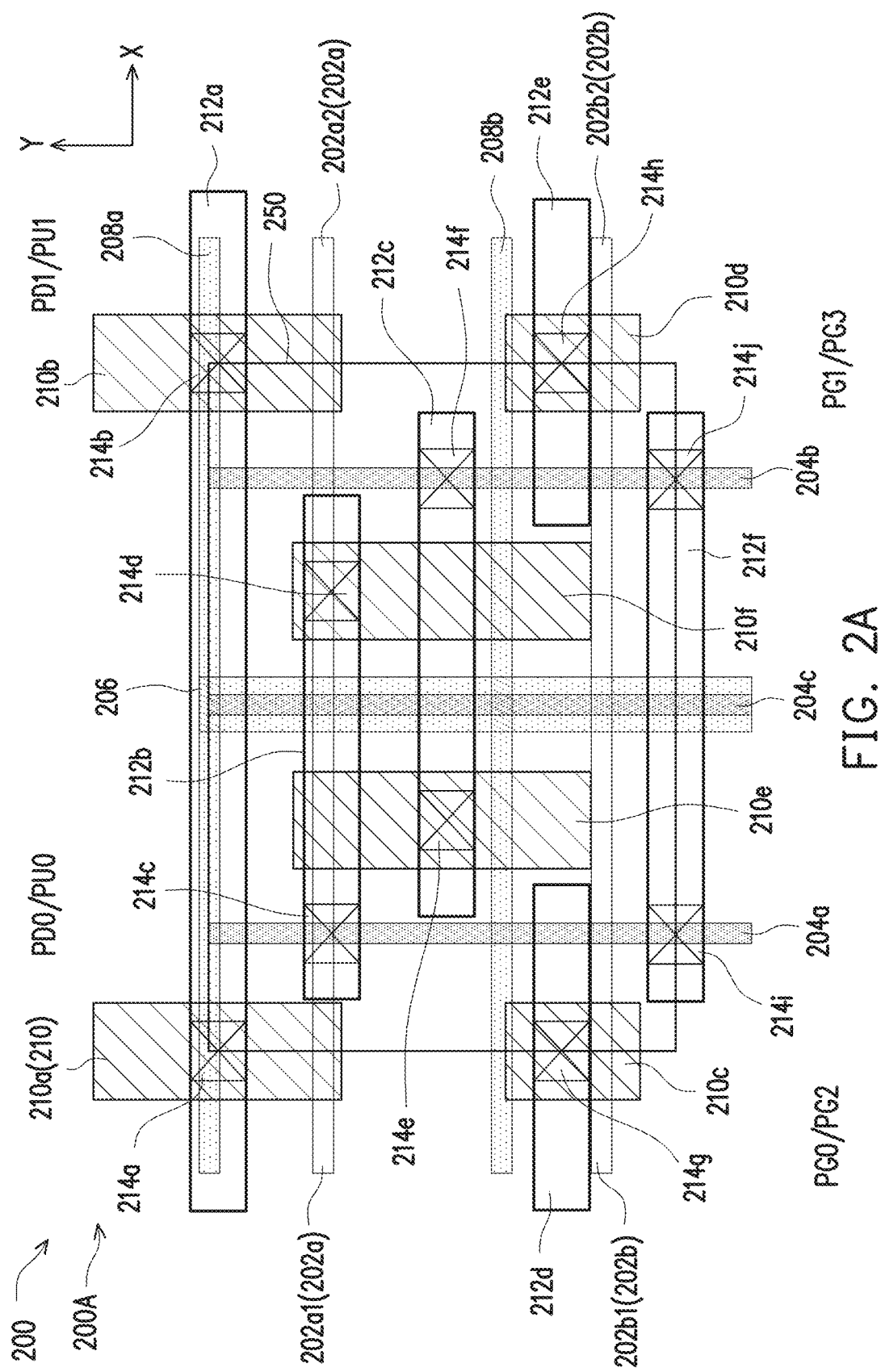
FIGS. 2A, 2B and 2C are diagrams of a layout design, in accordance with some embodiments.
Figure 2B:
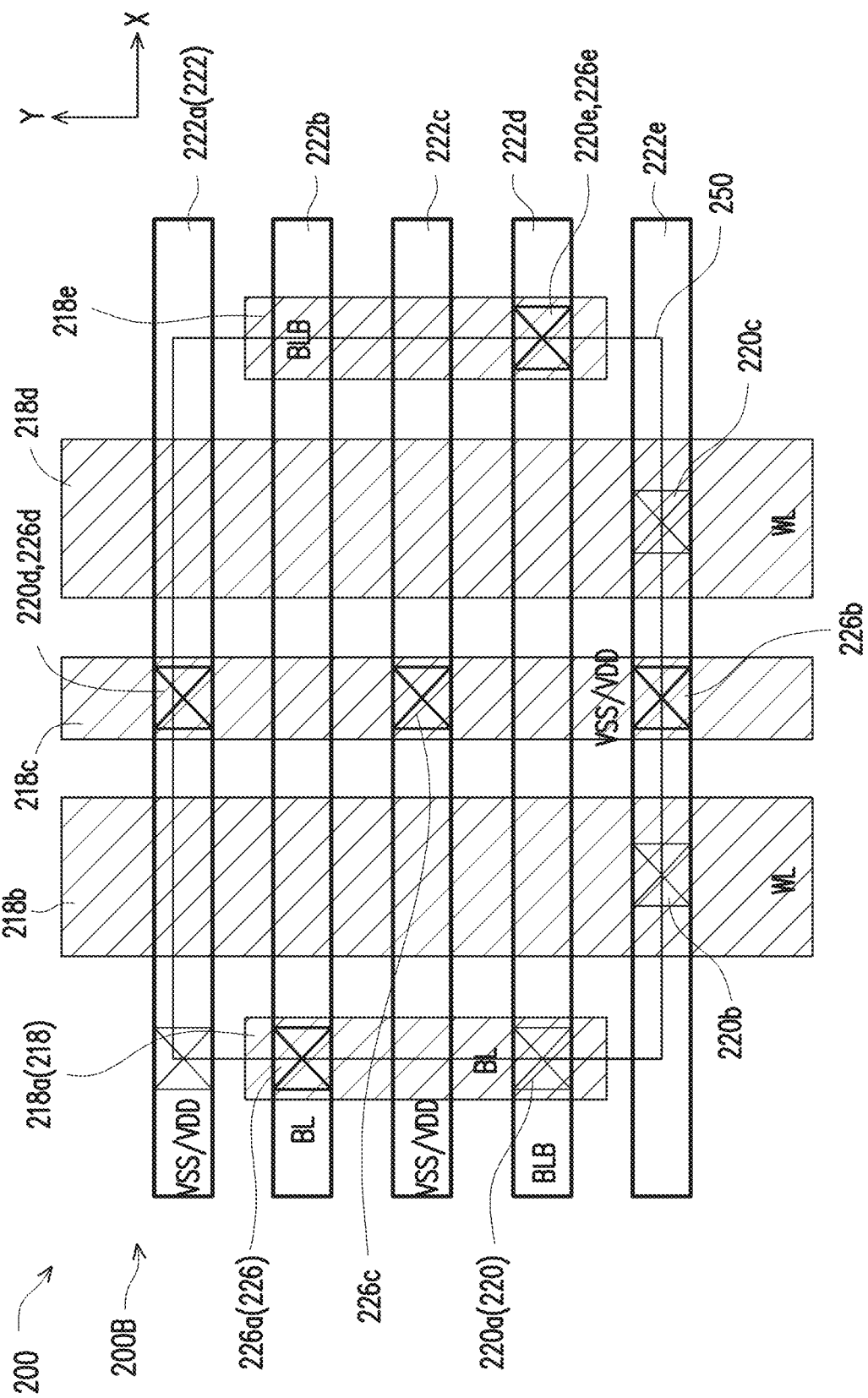
Figure 2C:
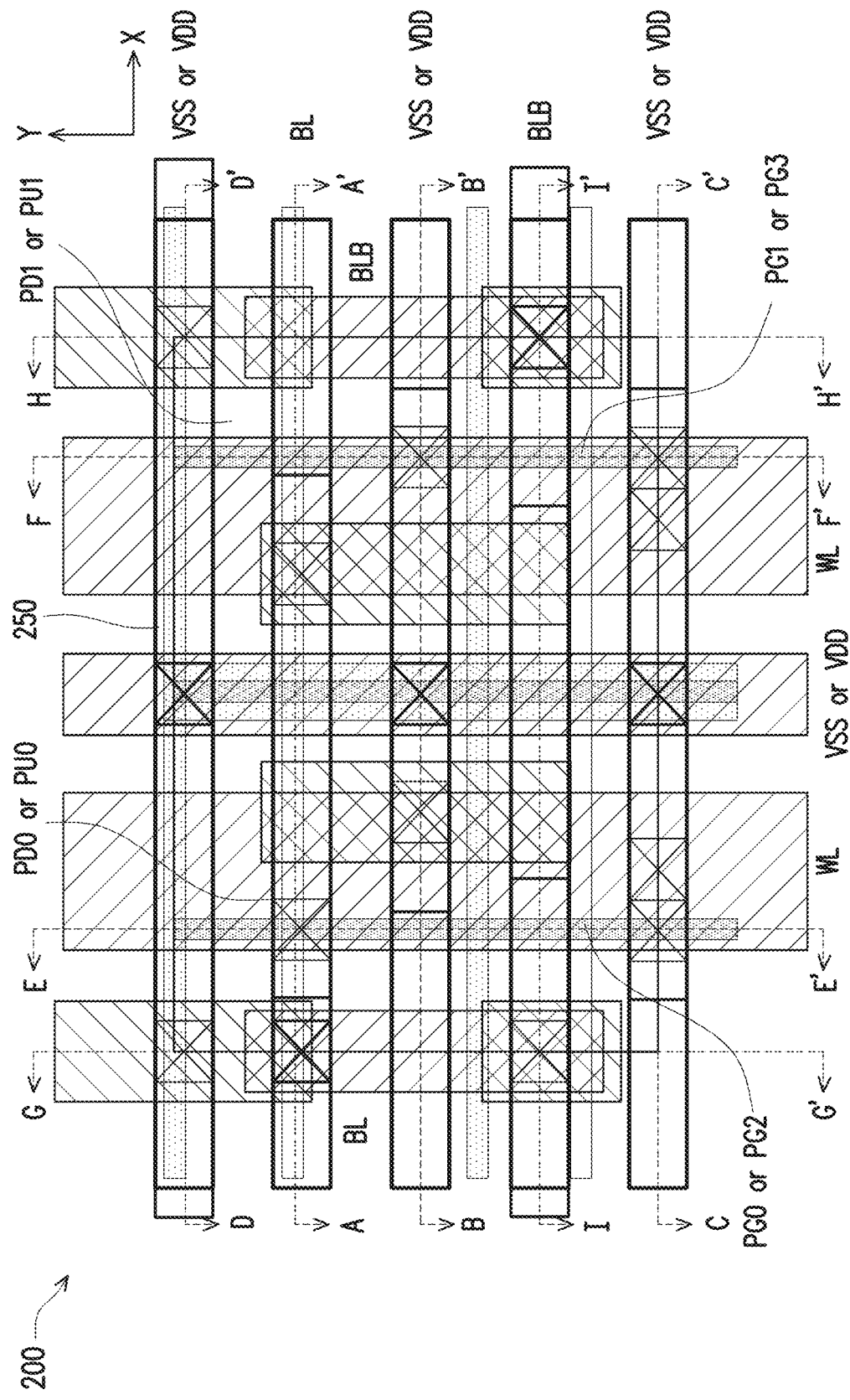

FIGS. 2A-2C are diagrams of a layout design 200, in accordance with some embodiments. Layout design 200 is a layout diagram of memory cell 100B of FIG. 1B or memory cell 100C of FIG. 1C. Layout design 200 is usable to manufacture memory cell 100B or 100C.

Layout design 200 includes a portion 200A (FIG. 2A) and a portion 200B (FIG. 2B). For ease of illustration, layout design 200 of FIG. 2A does not include portion 200B. Similarly, for ease of illustration, layout design 200 of FIG. 2B does not include portion 200A.

Layout design 200, as shown in FIG. 2C, includes portion 200A of FIG. 2A and portion 200B of FIG. 2B. In other words, layout design of FIG. 2C is the combination of layout portion 200A of FIG. 2A and layout portion 200B of FIG. 2B, when the cell boundaries of portion 200A and portion 200B are aligned. For ease of illustration, some of the labeled elements of FIGS. 2A-2B are not labelled in FIG. 2C. In some embodiments, layout design 200 of FIGS. 2A-2C includes additional elements not shown in FIGS. 2A-2C.

Layout design 200 of FIG. 2A includes portion 200A. Portion 200A includes features of the active (OD) level, poly (Poly) level, metal on diffusion (MD) level, via over diffusion (VD) level and via over gate (VG) level of layout design 200.

Layout design 200 of FIG. 2B includes portion 200B. Portion 200B includes features of the metal 1 (M1) level, metal two (M2) level, via zero (V0) level and via one (V1) level of layout design 200.

Layout design 200 includes active region layout patterns 202a and 202b (collectively referred to as "set of active region layout patterns 202").

Active region layout pattern 202a is useable to manufacture active region 303a1, 303a2, 303b1 and 303b2 of integrated circuit 300 (FIGS. 3A-3I). Active region layout pattern 202b is useable to manufacture active regions 305a1, 305a2, 305b1 and 305b2 of integrated circuit 300 (FIGS. 3A-3I).

Active region layout pattern 202a includes an active region layout pattern 202a1 and an active region layout pattern 202a2. In some embodiments, active region layout pattern 202a1 is useable to manufacture active region 303a1 and 303a2 of integrated circuit 300 (FIGS. 3A-3I). In some embodiments, active region layout pattern 202a2 is useable to manufacture active region 303b1 and 303b2 of integrated circuit 300 (FIGS. 3A-3I).

Active region layout pattern 202b includes an active region layout pattern 202b1 and an active region layout pattern 202b2. In some embodiments, active region layout pattern 202b1 is useable to manufacture active region 305a1 and 305a2 of integrated circuit 300 (FIGS. 3A-3I). In some embodiments, active region layout pattern 202a2 is useable to manufacture active region 305b1 and 305b2 of integrated circuit 300 (FIGS. 3A-3I).

Each of the layout patterns of the set of active region layout patterns 202a extends in a first direction X and is located on a first layout level. In some embodiments, the first layout level corresponds to the active region of layout design 200 or 400 (FIG. 4). Layout patterns 202a and 202b of the set of active region layout patterns 202 are separated from each other in a second direction Y. In some embodiments, the second direction Y is different from the first direction X. In some embodiments, the set of active region layout patterns 202 is referred to as an oxide definition (OD) layout pattern which defines source or drain diffusion layout patterns of layout design 200 or 400. In some embodiments, the set of active region layout patterns 202 extends continuously through the cell boundaries of layout design 200 to other neighboring cells.

Layout design 200 further includes gate layout patterns 204a, 204b and 204c (collectively referred to as "set of gate layout patterns 204"). In some embodiments, gate layout patterns 204a and 204b are usable to manufacture corresponding gate structures 304a and 304b of integrated circuit 300 (FIGS. 3A-3I) and 500 (FIG. 5). Gate layout pattern 204c is between 204a and 204b. In some embodiments, gate layout pattern 204c is useable to manufacture a dummy gate structure (not shown) of integrated circuit 300 (FIGS. 3A-3I) and 500 (FIG. 5). In some embodiments, a dummy gate structure is a non-functional gate structure. At least the set of gate layout patterns 204 of layout design 200 or 400 (FIGS. 4A-4B) or the set of gates 304 of integrated circuit 300 (FIGS. 3A-3I) and 500 (FIG. 5) have a contact poly pitch (CPP) of 3. Stated differently, in some embodiments, a width of the cell boundary of layout design 200 in the first direction X is equal to the CPP (e.g., 3). In some embodiments, by having a CPP of 3, layout design 200 or 400 (FIGS. 4A-4B) or integrated circuit 300 (FIGS. 3A-3I) and 500 (FIG. 5) have a higher density than other approaches.

In some embodiments, gate layout pattern 204a is useable to manufacture gate regions of PMOS transistor PG0 and NMOS transistor PD0 or gate regions of PMOS transistor PU0 and NMOS transistor PG2. In some embodiments, gate layout pattern 204b is useable to manufacture gate regions of PMOS transistor PG1 and NMOS transistor PD1 or gate regions of PMOS transistor PU1 and NMOS transistor PG3.

In some embodiments, each gate layout pattern of the set of gate layout patterns 204 extends in the second direction Y and overlaps the set of active region layout patterns 202. In some embodiments, each gate layout pattern of the set of gate layout patterns 204 is separated from an adjacent gate layout pattern of the set of gate layout patterns 204 in the first direction X. In some embodiments, an adjacent element is next to or directly next to another element. For example, in some embodiments, gate layout pattern 204a is adjacent to gate layout pattern 204c. In some embodiments, active region layout pattern 202a is adjacent to active region layout pattern 202b.

The set of gate layout patterns 204 is positioned on a second layout level different from the first layout level. In some embodiments, the second layout level corresponds to the POLY level of layout design 200 or 400 (FIG. 4). The set of active region layout patterns 202 is below the set of gate layout patterns 204. Other quantities or configurations of the set of gate layout patterns 204 are within the scope of the present disclosure.

Layout design 200 further includes a continuous polysilicon on oxide diffusion (OD) edge (CPODE) layout pattern 206. CPODE layout pattern 206 extends in the second direction Y, and covers gate layout pattern 204c. In some embodiments, CPODE layout pattern 206 is useable to indicate that a dummy gate structure (gate structure 304c manufactured by gate layout pattern 204c) of integrated circuit 300 (FIGS. 3A-3I) and 500 (FIG. 5) is removed, and a trench is formed and filled with an insulating portion 330 in the first well 301 (FIGS. 3A-3I) and the second well 302 (FIGS. 3A-3I). In some embodiments, a dummy gate structure is a non-functional gate structure. In some embodiments, gate layout pattern 204c is CPODE layout pattern 206. In some embodiments, CPODE layout pattern 206 is used to indicate that gate layout pattern 204c is a dummy gate layout pattern. Other configurations or quantities of patterns in the CPODE layout pattern 206 are within the scope of the present disclosure.

Layout design 200 further includes poly cut feature layout patterns 208a and 208b (collectively referred to as "set of cut feature layout patterns 208"). Set of poly cut feature layout patterns 208 extends in the first direction X. Poly cut feature layout pattern 208b overlaps set of gate layout patterns 204 in a middle portion of layout design 200. Poly cut feature layout pattern 208a overlaps set of gate layout patterns 204 along cell boundary 250 of layout design 200. In some embodiments, each cut feature layout pattern (208a or 208b) of the set of poly cut feature layout patterns 208 is separated from another cut feature layout pattern (208b or 208a) of the set of poly cut feature layout patterns 208 in the second direction Y. In some embodiments, the set of poly cut feature layout patterns 208 extends continuously through the cell boundaries of layout design 200 to other neighboring cells.

Figure 5:
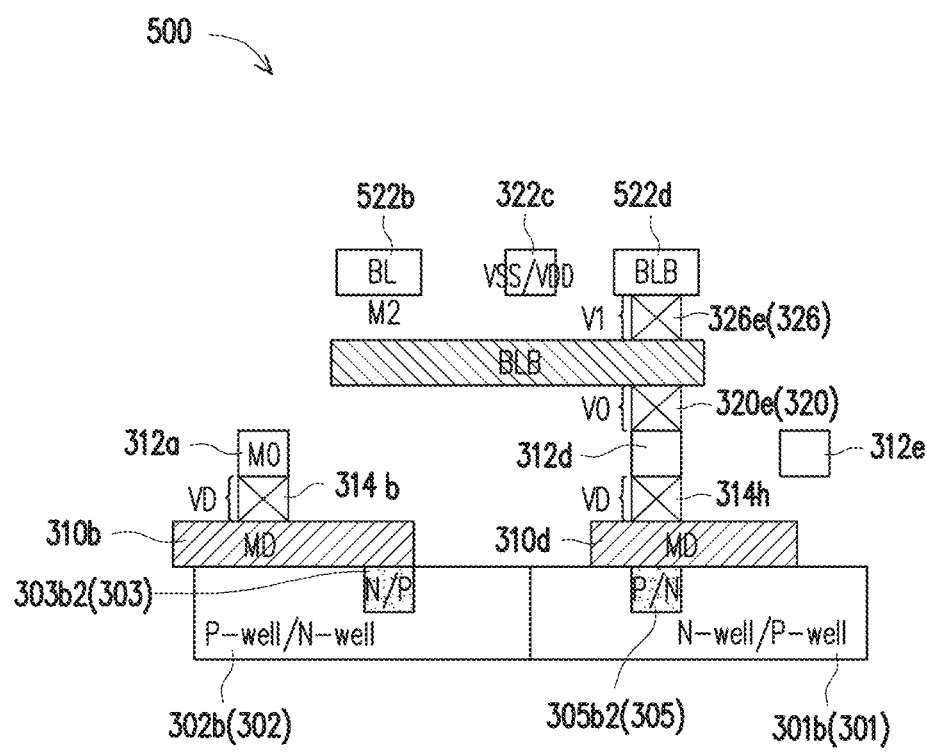
FIG. 5 is a diagram of an integrated circuit, in accordance with some embodiments.
Figure 6A:
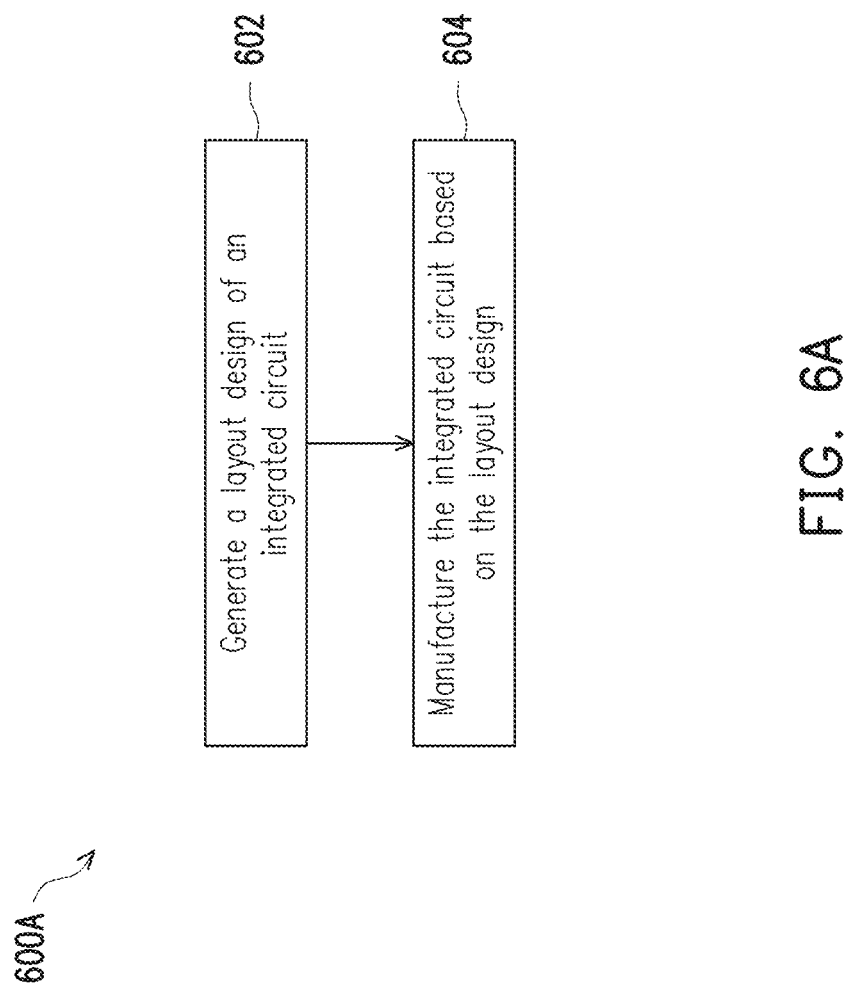
FIG. 6A is a flowchart of a method of manufacturing an integrated circuit, in accordance with some embodiments.

Set of poly cut feature layout patterns 208 has a pattern width $W_{IV}$ (not labelled) in the second direction Y, and a pattern length L (not labelled) in the first direction X. In some embodiments, poly cut feature layout patterns 208a and 208b are usable to identify a corresponding location of a portion of corresponding gate structure 304a and 304b of integrated circuit 300 or 500 (FIG. 5) that is removed during operation 604 of method 600A (FIG. 6A).

In some embodiments, the pattern width $W_{IV}$ (not labelled) corresponds to the cut width $D_V$ (not labelled) of one or more of gate structures 304a1, 304a2, 304b1 and 304b2. In some embodiments, the pattern length L (not labelled) corresponds to the cut length $L_V$ (not labelled) of one or more of gate structures 304a1, 304a2, 304b1 and 304b2. In some embodiments, at least one of the set of gate layout patterns 204, the CPODE layout pattern 206 or the set of poly cut feature layout patterns 210 is located on a poly-gate layout level (POLY). Other configurations or quantities of patterns in the poly cut feature layout pattern 210 are within the scope of the present disclosure.

Layout design 200 further includes conductive feature layout patterns 210a, 210b, 210c, 210d, 210e and 210f (collectively referred to as "set of conductive feature layout patterns 210"). In some embodiments, conductive feature layout patterns 210a, 210b, 210c, 210d, 210e and 210f are usable to manufacture corresponding conductive structures 310a, 310b, 310c, 310d, 310e and 310f of integrated circuit 300 (FIG. 3A-3I) and 500 (FIG. 5).

In some embodiments, the set of conductive feature layout patterns 210 extends in the second direction Y, and is over the set of active region layout patterns 202. Conductive feature layout patterns 210a and 210b overlap active region layout pattern 202a. In some embodiments, conductive feature layout patterns 210a and 210b overlap cell boundary 250. Conductive feature layout patterns 210c and 210d overlap active region layout pattern 202b. In some embodiments, at least conductive feature layout pattern 210e or 210f overlaps active region layout pattern 202a. In some embodiments, at least conductive feature layout pattern 210e or 210f overlaps active region layout pattern 202b.

In some embodiments, at least conductive feature layout pattern 210e or 210f extends from active region layout pattern 202a to active region layout pattern 202b. In some embodiments, at least a side of conductive feature layout pattern 210e or 210f directly contacts or abuts a side of active region layout pattern 202b. In some embodiments, at least conductive feature layout pattern 210e or 210f extends from active region layout pattern 202a to a side of active region layout pattern 202b.

In some embodiments, each conductive feature layout pattern of the set of conductive feature layout patterns 210 is separated from an adjacent layout pattern of the set of conductive feature layout patterns 210 in at least the first direction X or the second direction Y. The set of conductive feature layout patterns 210 is on a third layout level different from the first layout level and the second layout level. In some embodiments, the third layout level corresponds to the metal over diffusion (MD) level of layout design 200 or 400 (FIG. 4). Other quantities or configurations of the set of conductive feature layout patterns 210 are within the scope of the present disclosure.

Layout design 200 further includes conductive feature layout patterns 212a, 212b, 212c, 212d, 212e and 212f (collectively referred to as "set of conductive feature layout patterns 212"). In some embodiments, conductive feature layout patterns 212a, 212b, 212c, 212d, 212e and 212f are usable to manufacture corresponding conductive structures 312a, 312b, 312c, 312d, 312e and 312f of integrated circuit 300 (FIG. 3A-3I) and 500 (FIG. 5).

In some embodiments, the set of conductive feature layout patterns 212 extends in the first direction X, and is over at least the set of active region layout patterns 210 or the set of gate layout patterns 204.

Conductive feature layout pattern 212a overlaps conductive feature layout patterns 210a and 210b, cut feature layout pattern 208a and CPODE layout pattern 206. Each of conductive feature layout patterns 212b and 212c overlaps conductive feature layout patterns 210e and 210f, and CPODE layout pattern 206. Conductive feature layout patterns 212d and 212e overlap corresponding conductive feature layout patterns 210c and 210d. Conductive feature layout pattern 212b overlaps conductive feature layout patterns 210a and 210b, cut feature layout pattern 208a and CPODE layout pattern 206.

Conductive feature layout pattern 212a overlaps gate layout patterns 204a, 204b and 204c. Conductive feature layout pattern 212b overlaps gate layout patterns 204a and 204c. Conductive feature layout pattern 212c overlaps gate layout patterns 204b and 204c. Conductive feature layout patterns 212d and 212e overlaps corresponding gate layout patterns 204a and 204b. Conductive feature layout pattern 212f overlaps gate layout patterns 204a, 204b and 204c, and CPODE layout pattern 206.

In some embodiments, each conductive feature layout pattern of the set of conductive feature layout patterns 212 is separated from an adjacent layout pattern of the set of conductive feature layout patterns 212 in at least the first direction X or the second direction Y. The set of conductive feature layout patterns 212 is on a fourth layout level different from the first layout level, the second layout level and the third layout level. In some embodiments, the fourth layout level corresponds to the metal zero (M0) level of layout design 200 or 400 (FIG. 4). Other quantities or configurations of the set of conductive feature layout patterns 212 are within the scope of the present disclosure.

Layout design 200 further includes via layout patterns 214a, 214b, 214c, 214d, 214e, 214f, 214g and 214h (collectively referred to as "set of via layout patterns 214"). In some embodiments, via layout patterns 214a, 214b, 214c, 214d, 214e, 214f, 214g and 214h are usable to manufacture corresponding vias 314a, 314b, 314c, 314d, 314e, 314f, 314g and 314h of integrated circuit 300 (FIG. 3A-3I) and 500 (FIG. 5).

In some embodiments, via layout patterns 214c and 214i of the set of via layout patterns 214 are located where corresponding conductive feature layout patterns 212b and 212f of the set of conductive feature layout patterns 212 overlaps gate layout pattern 204a of the set of gate layout patterns 204.

In some embodiments, via layout patterns 214f and 214j of the set of via layout patterns 214 are located where corresponding conductive feature layout pattern 212c and 212f of the set of conductive feature layout patterns 212 overlaps gate layout pattern 204b of the set of gate layout patterns 204.

In some embodiments, one or more of the set of via layout patterns 214 are between one or more of the set of conductive feature layout patterns 212 and one or more of the set of gate layout patterns 204.

In some embodiments, via layout patterns 214a and 214b of the set of via layout patterns 214 are located where conductive feature layout pattern 212a of the set of conductive feature layout patterns 212 overlaps corresponding conductive feature layout pattern 210a and 210b of the set of conductive feature layout patterns 210.

In some embodiments, via layout patterns 214d and 214e of the set of via layout patterns 214 are located where corresponding conductive feature layout pattern 212b and 212c of the set of conductive feature layout patterns 212 overlaps corresponding conductive feature layout pattern 210f and 210e of the set of conductive feature layout patterns 210.

In some embodiments, via layout patterns 214g and 214h of the set of via layout patterns 214 are located where corresponding conductive feature layout pattern 212d and 212e of the set of conductive feature layout patterns 212 overlaps corresponding conductive feature layout pattern 210c and 210d of the set of conductive feature layout patterns 210.

In some embodiments, one or more of the set of via layout patterns 214 are between one or more of the set of conductive feature layout patterns 212 and one or more of the set of active region layout patterns 210.

In some embodiments, via layout patterns 214c, 214f, 214i and 214j of the set of via layout patterns 214 are on at least the via over gate (VG) level of layout design 200 or 400 (FIG. 4). In some embodiments, the VG level is between the fourth layout level and the second layout level of layout design 200 or 400 (FIG. 4).

In some embodiments, via layout patterns 214a, 214b, 214d, 214e, 214g and 214h of the set of via layout patterns 214 are on at least the via over diffusion (VD) level of layout design 200 or 400 (FIG. 4). In some embodiments, the VD level is between the fourth layout level and the third layout level of layout design 200 or 400 (FIG. 4).

Other quantities or configurations of the set of via layout patterns 214 are within the scope of the present disclosure.

Layout design 200 further includes conductive feature layout patterns 218a, 218b, 218c, 218d and 218e (collectively referred to as "set of conductive feature layout patterns 218") as shown in FIG. 2B. In some embodiments, conductive feature layout patterns 218a, 218b, 218c, 218d and 218e are usable to manufacture corresponding conductive structures 318a, 318b, 318c, 318d and 318e of integrated circuit 300 (FIG. 3A-3I) and 500 (FIG. 5).

In some embodiments, the set of conductive feature layout patterns 218 extends in the second direction Y, and is over at least the set of active region layout patterns 210, the set of gate layout patterns 204, or the set of conductive feature layout patterns 212.

Conductive feature layout pattern 218a overlaps active region layout patterns 202a and 202b, cut feature layout pattern 208b, conductive feature layout pattern 212d and at least a portion of conductive feature layout patterns 210a and 210c.

Conductive feature layout pattern 218b overlaps active region layout patterns 202a and 202b, cut feature layout patterns 208a and 208b, conductive feature layout patterns 212a, 212b, 212c, 212d and 212f, gate layout pattern 204a, and at least a portion of conductive feature layout pattern 210e.

Conductive feature layout pattern 218c overlaps active region layout patterns 202a and 202b, cut feature layout patterns 208a and 208b, CPODE layout pattern 206, conductive feature layout patterns 212a, 212b, 212c and 212f, and gate layout pattern 204b.

Conductive feature layout pattern 218d overlaps active region layout patterns 202a and 202b, cut feature layout patterns 208a and 208b, conductive feature layout patterns 212a, 212b, 212c, 212e and 212f, gate layout pattern 204c, and at least a portion of conductive feature layout pattern 210f.

Conductive feature layout pattern 218e overlaps active region layout patterns 202a and 202b, cut feature layout pattern 208b, conductive feature layout pattern 212e and at least a portion of conductive feature layout patterns 210b and 210d.

In some embodiments, each conductive feature layout pattern of the set of conductive feature layout patterns 218 is separated from an adjacent layout pattern of the set of conductive feature layout patterns 218 in at least the first direction X. The set of conductive feature layout patterns 218 is on a fifth layout level different from the first layout level, the second layout level, the third layout level and the fourth layout level. In some embodiments, the fifth layout level corresponds to the metal one (M1) level of layout design 200 or 400 (FIG. 4). Other quantities or configurations of the set of conductive feature layout patterns 218 are within the scope of the present disclosure.

Layout design 200 further includes via layout patterns 220a, 220b, 220c, 220d and 220e (collectively referred to as "set of via layout patterns 220"). In some embodiments, via layout patterns 220a, 220b, 220c, 220d and 220e are usable to manufacture corresponding vias 320a, 320b, 320c, 320d and 320e of integrated circuit 300 (FIG. 3A-3I) and 500 (FIG. 5).

In some embodiments, one or more of the set of via layout patterns 220 are between one or more of the set of conductive feature layout patterns 218 and one or more of the conductive feature layout patterns 212.

In some embodiments, via layout patterns 220a and 220e of the set of via layout patterns 220 are located where corresponding conductive feature layout patterns 218a and 218e of the set of conductive feature layout patterns 218 overlap corresponding conductive feature layout patterns 212b and 212e of the set of conductive feature layout patterns 212.

In some embodiments, via layout patterns 220b and 220c of the set of via layout patterns 220 are located where corresponding conductive feature layout patterns 218b and 218d of the set of conductive feature layout patterns 218 overlap conductive feature layout patterns 212f of the set of conductive feature layout patterns 212.

In some embodiments, via layout pattern 220d of the set of via layout patterns 220 is located where conductive feature layout pattern 218c of the set of conductive feature layout patterns 218 overlaps conductive feature layout pattern 212a of the set of conductive feature layout patterns 212.

In some embodiments, the set of via layout patterns 220 are on at least the via zero (V0) level of layout design 200 or 400 (FIG. 4). In some embodiments, the V0 level is between the fourth layout level and the fifth layout level of layout design 200 or 400 (FIG. 4). Other quantities or configurations of the set of via layout patterns 220 are within the scope of the present disclosure.

Layout design 200 further includes conductive feature layout patterns 222a, 222b, 222c, 222d and 222e (collectively referred to as "set of conductive feature layout patterns 222"). In some embodiments, conductive feature layout patterns 222a, 222b, 222c, 222d and 222e are usable to manufacture corresponding conductive structures 322a, 322b, 322c, 322d and 322e of integrated circuit 300 (FIG. 3A-3I) and 500 (FIG. 5).

In some embodiments, the set of conductive feature layout patterns 222 extends in the first direction X, and is over at least the set of active region layout patterns 210, the set of gate layout patterns 204, the set of conductive feature layout patterns 212 or the set of conductive feature layout patterns 218.

Conductive feature layout pattern 222a overlaps cut feature layout pattern 208a, conductive feature layout pattern 212a, conductive feature layout patterns 210a and 210b, gate layout patterns 204a, 204b and 204c, CPODE layout pattern 206 and conductive feature layout patterns 218b, 218c and 218d.

Conductive feature layout pattern 222b overlaps active region layout pattern 202a, conductive feature layout patterns 212b, gate layout patterns 204a, 204b and 204c, CPODE layout pattern 206, conductive feature layout patterns 218a, 218b, 218c, 218d and 218e, and at least a portion of conductive feature layout patterns 210a, 210b, 210e and 210f.

Conductive feature layout pattern 222c overlaps conductive feature layout patterns 212c, gate layout patterns 204a, 204b and 204c, CPODE layout pattern 206, conductive feature layout patterns 218a, 218b, 218c, 218d and 218e, and at least a portion of conductive feature layout patterns 210e and 210f.

Conductive feature layout pattern 222d overlaps conductive feature layout patterns 212d and 212e, gate layout patterns 204a, 204b and 204c, CPODE layout pattern 206, conductive feature layout patterns 218a, 218b, 218c, 218d and 218e, and at least a portion of conductive feature layout patterns 210c, 210d, 210e and 210f. In some embodiments, conductive feature layout pattern 222d overlaps at least a portion of active region layout pattern 202b.

Conductive feature layout pattern 222e overlaps conductive feature layout pattern 212f, gate layout patterns 204a, 204b and 204c, CPODE layout pattern 206 and conductive feature layout patterns 218b, 218c and 218d.

In some embodiments, each conductive feature layout pattern of the set of conductive feature layout patterns 222 is separated from an adjacent layout pattern of the set of conductive feature layout patterns 222 in at least the second direction Y. The set of conductive feature layout patterns 222 is on a sixth layout level different from the first layout level, the second layout level, the third layout level, the fourth layout level and the fifth layout level. In some embodiments, the sixth layout level corresponds to the metal two (M2) level of layout design 200 or 400 (FIG. 4). Other quantities or configurations of the set of conductive feature layout patterns 222 are within the scope of the present disclosure.

Layout design 200 further includes via layout patterns 226a, 226b, 226c, 226d and 226e (collectively referred to as "set of via layout patterns 226"). In some embodiments, via layout patterns 226a, 226b, 226c, 226d and 226e are usable to manufacture corresponding vias 326a, 326b, 326c, 326d and 326e of integrated circuit 300 (FIG. 3A-3I) and 500 (FIG. 5).

In some embodiments, one or more of the set of via layout patterns 226 are between one or more of the set of conductive feature layout patterns 222 and one or more of the conductive feature layout patterns 218.

In some embodiments, via layout pattern 226a of the set of via layout patterns 226 is located where corresponding conductive feature layout pattern 222b of the set of conductive feature layout patterns 222 overlaps conductive structure 218a of the set of conductive feature layout patterns 218.

In some embodiments, via layout patterns 226b, 226c and 226d of the set of via layout patterns 226 are located where corresponding conductive feature layout patterns 222e, 222c and 222a of the set of conductive feature layout patterns 222 overlap conductive structure 218c of the set of conductive feature layout patterns 218.

In some embodiments, via layout pattern 226e of the set of via layout patterns 226 is located where corresponding conductive feature layout pattern 222d of the set of conductive feature layout patterns 222 overlaps conductive structure 218e of the set of conductive feature layout patterns 218.

In some embodiments, each center of via layout patterns 220d and 220e is aligned with a corresponding center of corresponding via layout patterns 226d and 226e.

In some embodiments, at least a center of via layout pattern 220e, 226e or 214h is aligned with at least another center of via layout pattern 220e, 226e or 214h.

In some embodiments, a center of via layout pattern 220a is aligned with a center of via layout pattern 214g.

In some embodiments, the set of via layout patterns 226 are on at least the via one (V1) level of layout design 200 or 400 (FIG. 4). In some embodiments, the V1 level is between the fifth layout level and the sixth layout level of layout design 200 or 400 (FIG. 4). Other quantities or configurations of the set of via layout patterns 226 are within the scope of the present disclosure.

In some embodiments, by using conductive feature layout pattern 222b and 222d between conductive feature layout patterns 222a, 222c, 222e of layout design 200 results in layout design 200 or 400 having better electromagnetic shielding than other approaches. In some embodiments, by providing better electromagnetic shielding results in layout design 200 or 400 having less cross talk than other approaches.

Integrated Circuit—Cross-Sectional Views

FIGS. 3A, 3B, 3C, 3D, 3E, 3F, 3G, 3H and 3I are diagrams of an integrated circuit 300, in accordance with some embodiments.

Figure 3A:
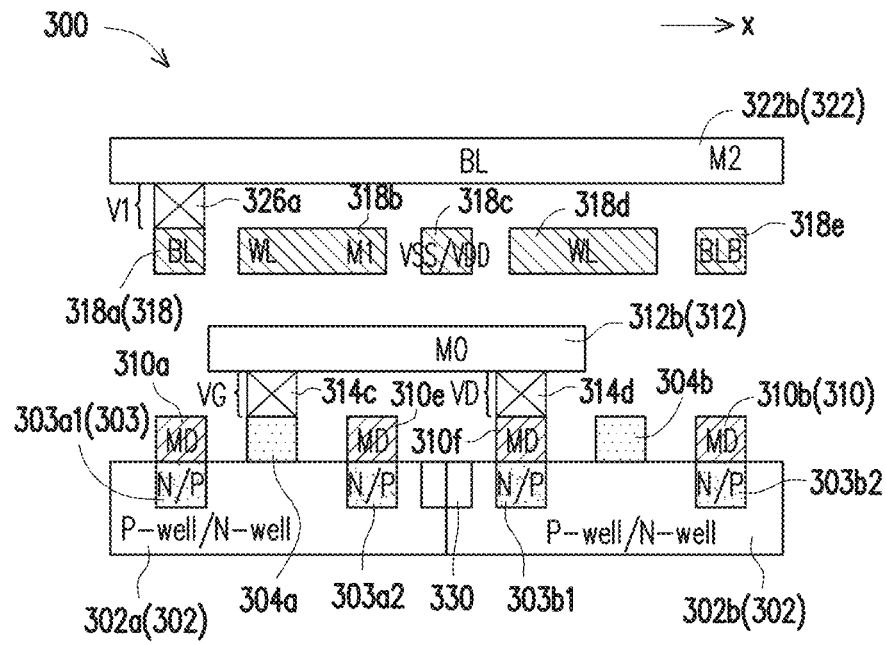
FIGS. 3A, 3B, 3C, 3D, 3E, 3F, 3G, 3H and 3I are diagrams of at least one integrated circuit, in accordance with some embodiments.
Figure 3B:
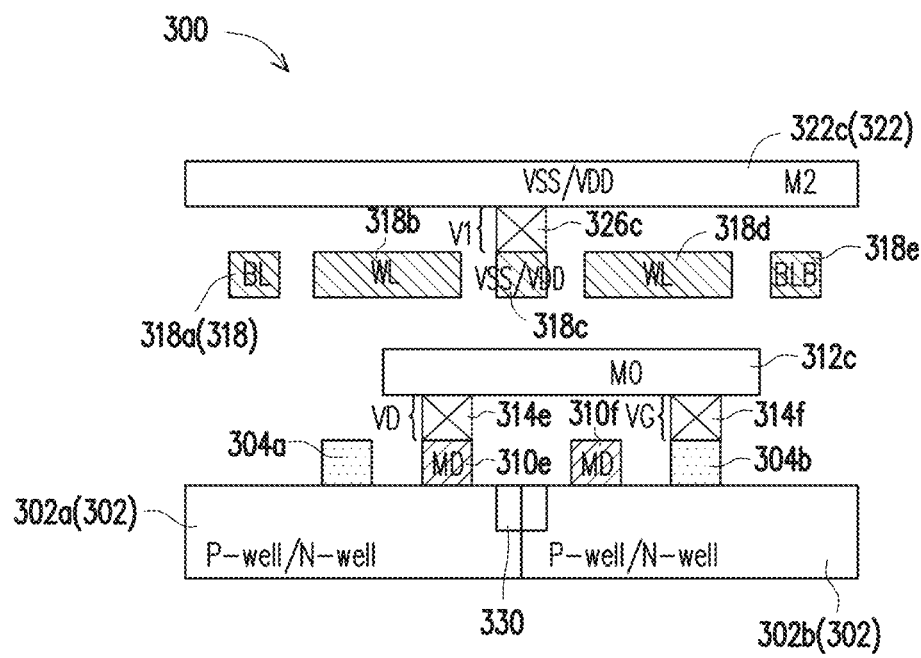
Figure 3C:
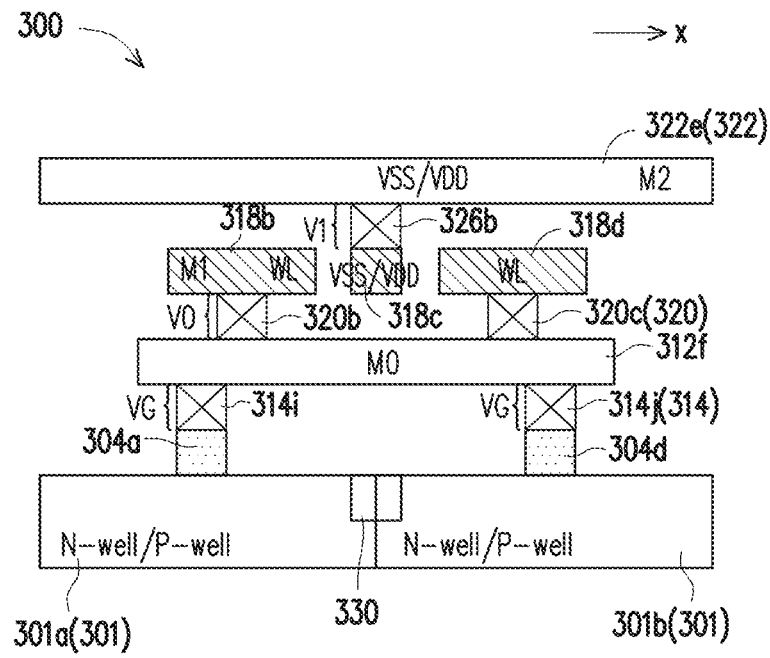
Figure 3D:
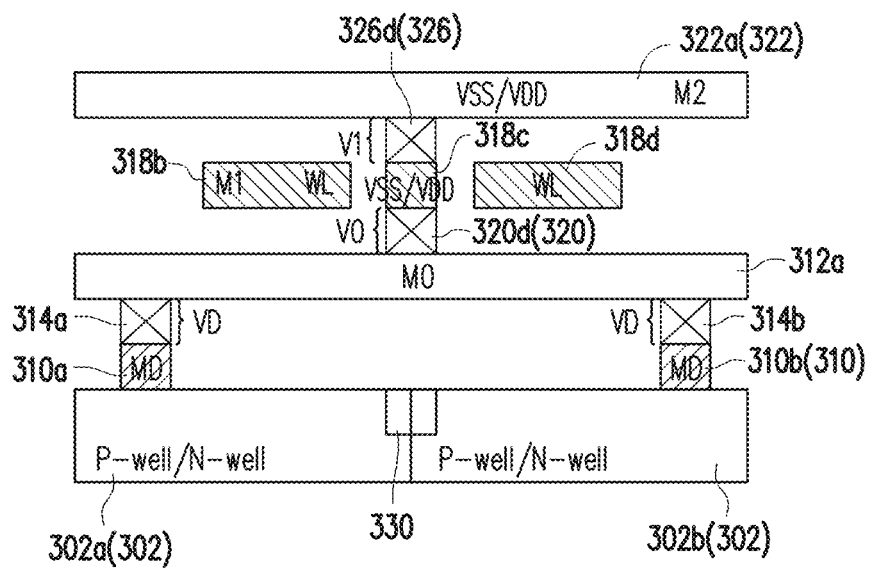
Figure 3E:
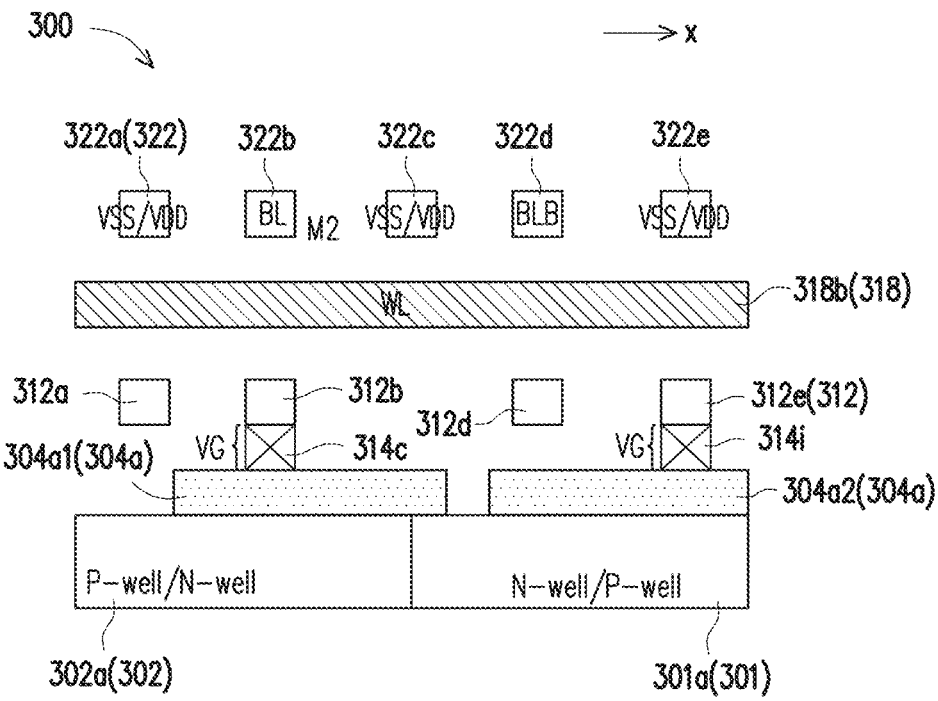
Figure 3F:
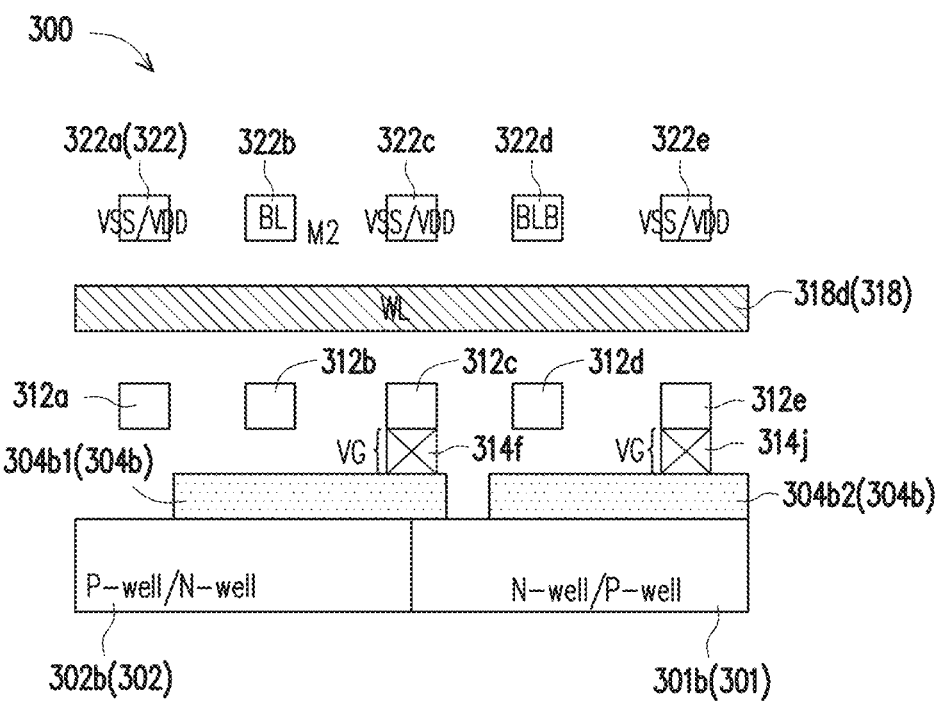
Figure 3G:
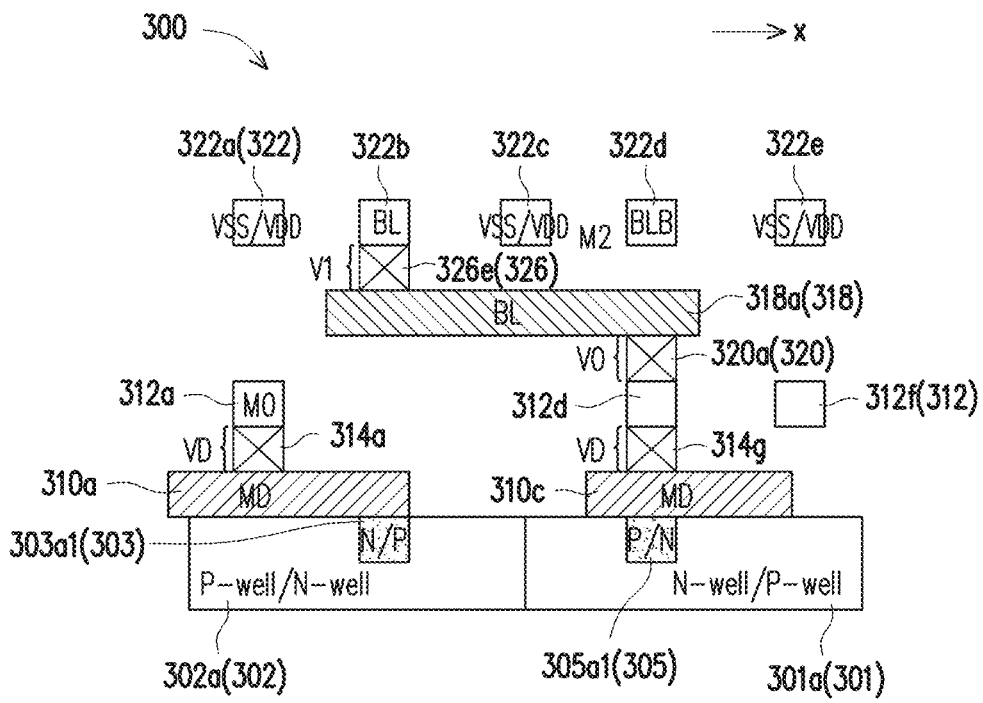
Figure 3H:
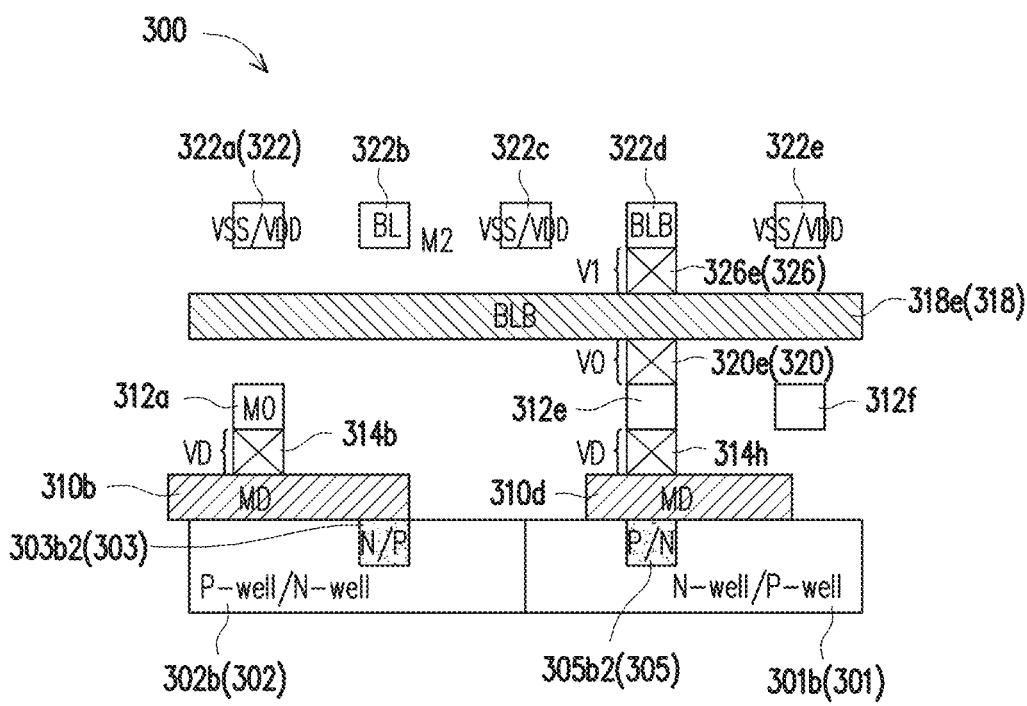
Figure 3I:
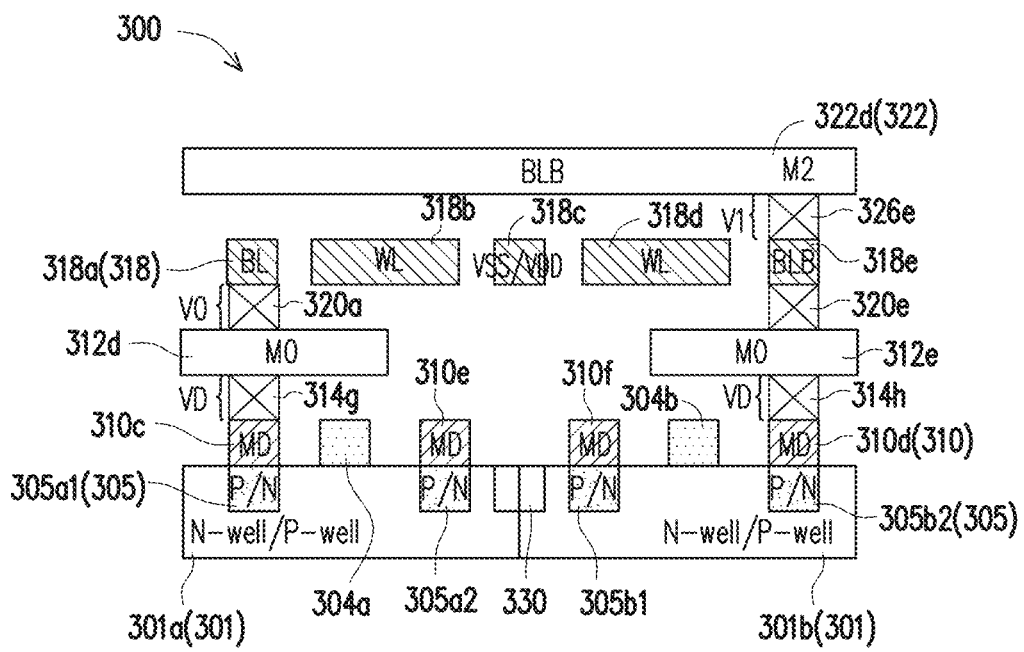

FIG. 3A is a cross-sectional view of an integrated circuit 300 corresponding to layout design 200 as intersected by plane A-A'. FIG. 3B is a cross-sectional view of an integrated circuit 300 corresponding to layout design 200 as intersected by plane B-B'. FIG. 3C is a cross-sectional view of an integrated circuit 300 corresponding to layout design 200 as intersected by plane C-C'. FIG. 3D is a cross-sectional view of an integrated circuit 300 corresponding to layout design 200 as intersected by plane D-D'. FIG. 3E is a cross-sectional view of an integrated circuit 300 corresponding to layout design 200 as intersected by plane E-E'. FIG. 3F is a cross-sectional view of an integrated circuit 300 corresponding to layout design 200 as intersected by plane F-F'. FIG. 3G is a cross-sectional view of an integrated circuit 300 corresponding to layout design 200 as intersected by plane G-G'. FIG. 3H is a cross-sectional view of an integrated circuit 300 corresponding to layout design 200 as intersected by plane H-H'. FIG. 3I is a cross-sectional view of an integrated circuit 300 corresponding to layout design 200 as intersected by plane I-I'.

Integrated circuit 300 is manufactured by layout design 200. Integrated circuit 300 is a structural implementation of memory cell 100B or 100C.

Figure 4A:
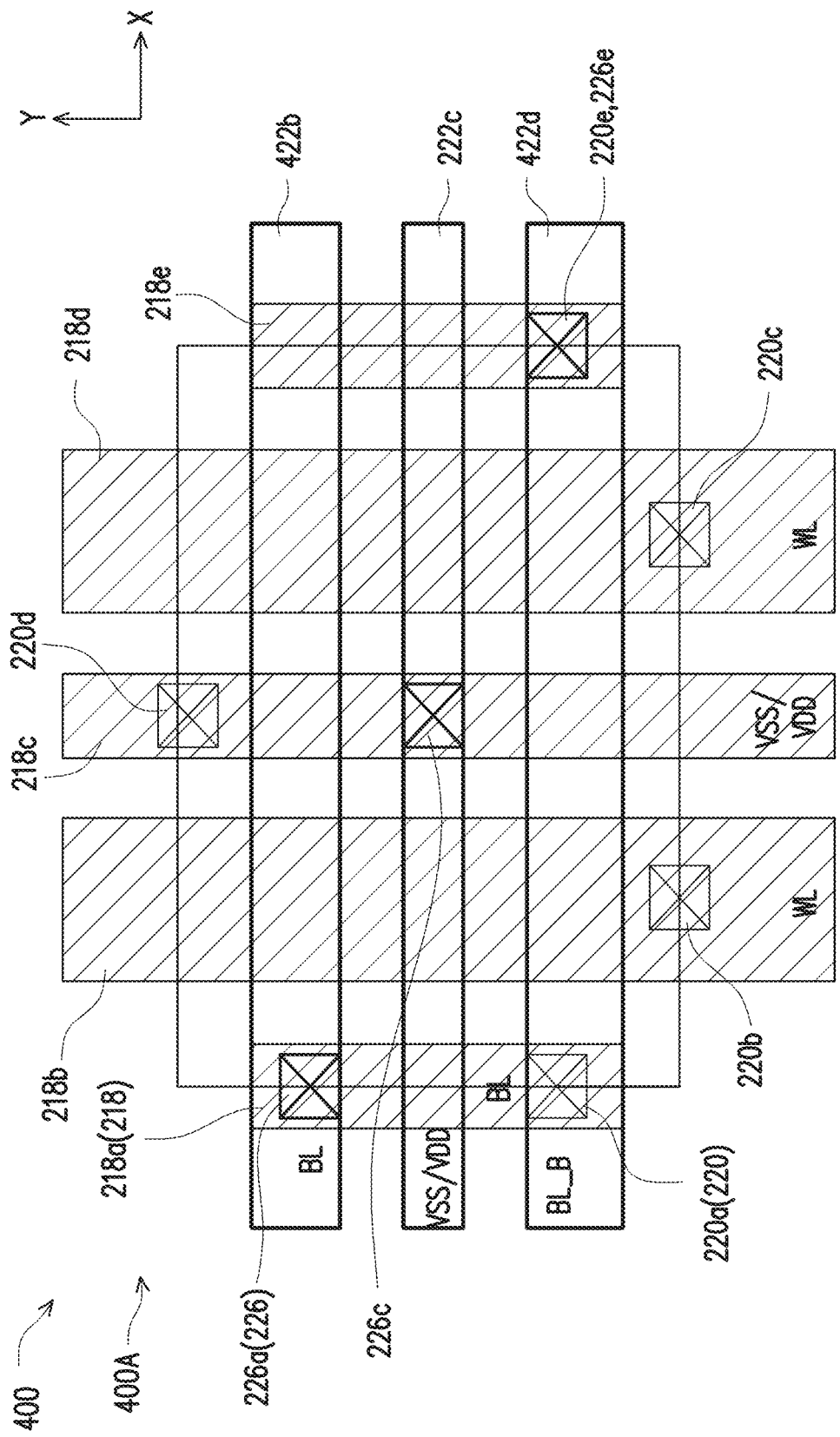
FIGS. 4A and 4B are diagrams of a layout design, in accordance with some embodiments.
Figure 4B:
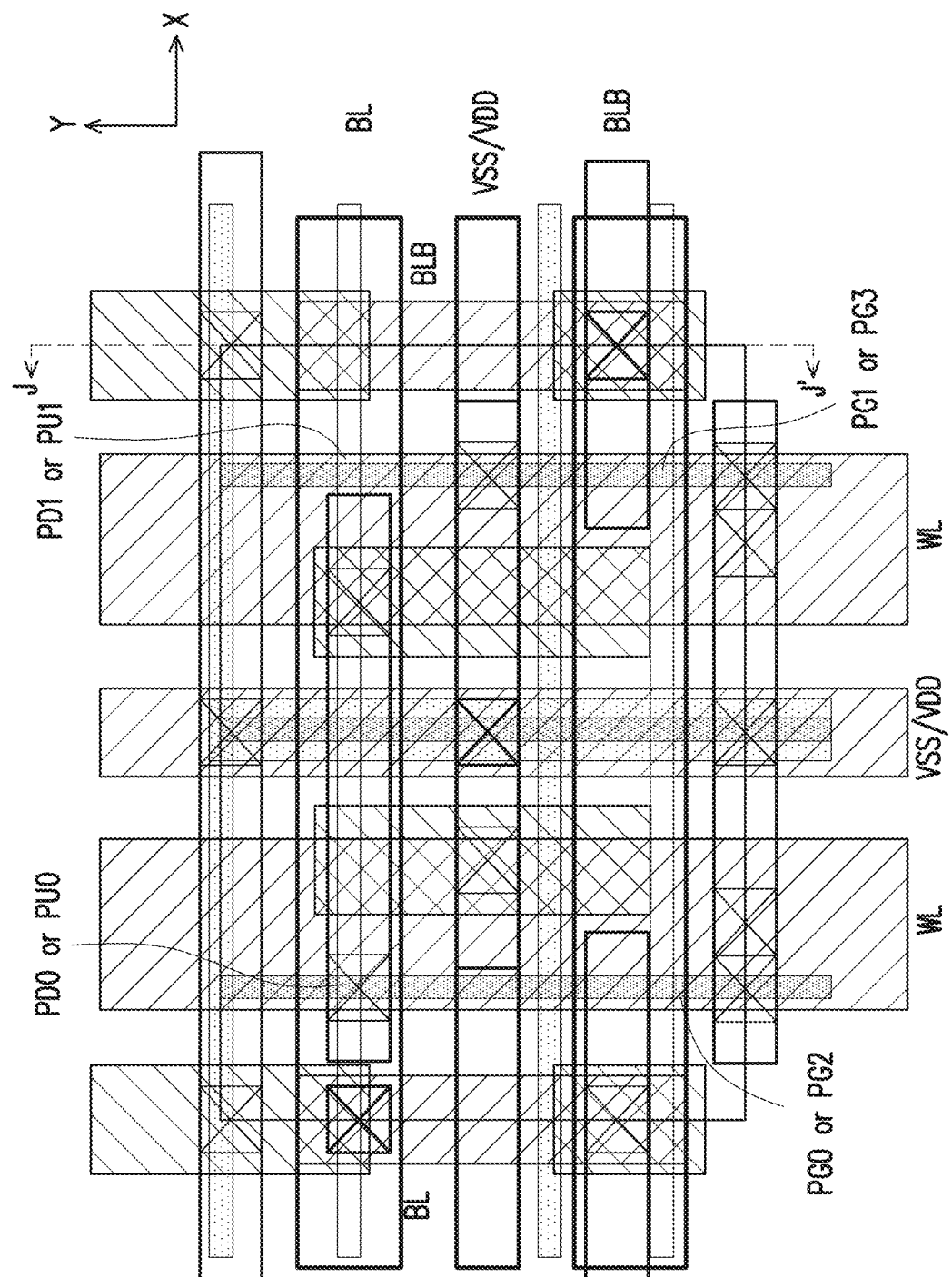

Structural relationships including alignment, lengths and widths, as well as configurations of integrated circuit 300 or 500 are similar to the structural relationships and configurations of layout design 200 of FIGS. 2A-2B and layout design 400 of FIGS. 4A-4B, and will not be described in FIGS. 3A-3I for brevity.

Integrated circuit 300 includes a first well 301 and a second well 302. Each of the first well 301 and the second well 302 is located on at least the first level of integrated circuit 300, and extends in at least the first direction X or the second direction Y. In some embodiments, the first well 301 and the second well 302 are adjacent to each other, and are separated from each other in the second direction Y.

The first well 301 includes a first portion 301a and a second portion 301b.

The second well 302 includes a first portion 302a and a second portion 302b.

The first portion 301a and the second portion 301b of the first well 301 of integrated circuit 300 include dopants of a first type. The first portion 302a and the second portion 302b of the second well 302 of integrated circuit 300 include dopants of a second type different from the first type.

In some embodiments, the first type is an N-type dopant and the second type is a P-type dopant. In some embodiments, the first type is a P-type dopant and the second type is an N-type dopant.

The first portion 301a and the second portion 301b of the first well 301 of integrated circuit 300 extend in the first direction X. In some embodiments, the first portion 301a and the second portion 301b are a continuous part of the first well 301. In some embodiments, the first portion 301a and the second portion 301b are separated by an insulating portion 330.

The first portion 302a and the second portion 302b of the second well 302 of integrated circuit 300 extend in the first direction X. In some embodiments, the first portion 302a and the second portion 302b are a continuous part of the second well 302. In some embodiments, the first portion 302a and the second portion 302b are separated by the insulating portion 330. In some embodiments, the insulating portion 330 extends in the second direction Y.

Other quantities or configurations of the first well 301 or the second well 302 are within the scope of the present disclosure.

Integrated circuit 300 further includes a set of active regions 303 and a set of active regions 305. The set of active regions 303 and the set of active regions 305 extend in the second direction Y. The set of active regions 303 and the set of active regions 305 are located on the first level of integrated circuit 300.

The set of active regions 303 includes one or more of active regions 303a1, 303a2, 303b1 and 303b2. Each of the active regions 303a1, 303a2, 303b1 and 303b2 of the set of active regions 303 is separated from an adjacent active region of the set of active regions 303 in the first direction X by a first pitch (not labelled).

Active regions 303a1 and 303a2 of the set of active regions 303 are embedded in the first portion 301a of the second well 302 of integrated circuit 300. Active region 303b1 and 303b2 of the set of active regions 303 are embedded in the second portion 301b of the second well 302 of integrated circuit 300. Active regions 303a1, 303a2, 303b1 and 303b2 include dopants of the first type.

The set of active regions 305 includes one or more of active regions 305a1, 305a2, 305b1 and 305b2. Each of the active regions 305a1, 305a2, 305b1 and 305b2 of the set of active regions 305 is separated from an adjacent active region of the set of active regions 305 in the first direction X by a second pitch (not labelled).

Active regions 305a1 and 305a2 of the set of active regions 305 are embedded in the first portion 301a of the first well 301 of integrated circuit 300. Active region 305b1 and 305b2 of the set of active regions 305 are embedded in the second portion 301b of the first well 301 of integrated circuit 300. Active regions 305a1, 305a2, 305b1 and 305b2 include dopants of the second type.

In some embodiments, integrated circuit 300 corresponds to memory cell 100B of FIG. 1B, and the first type is an N-type dopant and the second type is a P-type dopant, such that the first well 301 of integrated circuit 300 is an N-well, the second well 302 of integrated circuit 300 is a P-well, active regions 303a1, 303a2, 303b1 and 303b2 are n-type dopants embedded in the second well 302 (P-well), and active regions 305a1, 305a2, 305b1 and 305b2 are p-type dopants embedded in the first well 301 (N-well). In these embodiments, the first well 301 corresponds to the N-well of PMOS transistors PG0 and PG1 of memory cell 100B of FIG. 1B, and the second well 302 corresponds to the P-well of NMOS transistors PD0 and PD1 of memory cell 100B of FIG. 1B. In these embodiments, active regions 303a1 and 303b2 are corresponding source regions of corresponding NMOS transistors PD0 and PD1 of memory cell 100B of FIG. 1B, and active regions 303a2 and 303b1 are corresponding drain regions of corresponding NMOS transistors PD0 and PD1 of memory cell 100B of FIG. 1B. In these embodiments, active regions 305a1 and 305b2 are corresponding source or drain regions of corresponding PMOS transistors PG0 and PG1 of memory cell 100B of FIG. 1B, and active regions 305a2 and 305b1 are corresponding drain or source regions of corresponding PMOS transistors PG0 and PG1 of memory cell 100B of FIG. 1B.

In some embodiments, integrated circuit 300 corresponds to memory cell 100C of FIG. 1C, and the first type is a P-type dopant and the second type is an N-type dopant, such that the first well 301 of integrated circuit 300 is a P-well, and the second well 302 of integrated circuit 300 is an N-well, active regions 303a1, 303a2, 303b1 and 303b2 are p-type dopants embedded in the second well 302 (N-well), and active regions 305a1, 305a2, 305b1 and 305b2 are n-type dopants embedded in the first well 301 (P-well). In these embodiments, integrated circuit 300 corresponds to memory cell 100C of FIG. 1C, and the first well 301 corresponds to the P-well of NMOS transistors PG2 and PG3, and the second well 302 corresponds to the N-well of PMOS transistors PU0 and PU1 of memory cell 100C of FIG. 1C. In these embodiments, active regions 303a1 and 303b2 are corresponding source regions of corresponding PMOS transistors PU0 and PU1 of memory cell 100C of FIG. 1C, and active regions 303a2 and 303b1 are corresponding drain regions of corresponding PMOS transistors PU0 and PU1 of memory cell 100C of FIG. 1C. In these embodiments, active regions 305a1 and 305b2 are corresponding source or drain regions of corresponding NMOS transistors PG2 and PG3 of memory cell 100C of FIG. 1C, and active regions 305a2 and 305b1 are corresponding drain or source regions of corresponding NMOS transistors PG2 and PG3 of memory cell 100C of FIG. 1C.

Other quantities or configurations of the set of active regions 303 or 305 are within the scope of the present disclosure.

Integrated circuit 300 further includes a set of gates 304 extending in the second direction Y. The set of gates 304 are over the set of active regions 302 and 303 of integrated circuit 300. The set of gates 304 is located on a second level of integrated circuit 300 or 500. The second level is above the first level of integrated circuit 300 or 500. In some embodiments, the second level of integrated circuit 300 or 500 is referred to as the POLY level.

The set of gates 304 includes one or more of gate structures 304a or 304b. Gate structures 304a and 304b are separated from each other in the first direction X. Insulating portion 330 is between gate structures 304a and 304b, and is separated from each gate structure 304a or 304b by a gate pitch (not labelled).

Gate structure 304a includes gate structures 304a1 and 304a2. Gate structures 304a1 and 304a2 are separated from each other in the second direction Y by the cut width $D_y$ (not labelled).

Gate structure 304b includes gate structures 304b1 and 304b2. Gate structures 304b1 and 304b2 are separated from each other in the second direction Y by the cut width $D_y$ (not labelled).

In some embodiments, integrated circuit 300 corresponds to memory cell 100B of FIG. 1B, such that gate structures 304a1 and 304b1 are the corresponding gates of NMOS transistors PD0 and PD1, and gate structures 304a2 and 304b2 are the corresponding gates of PMOS transistors PG0 and PG1. In some embodiments, integrated circuit 300 corresponds to memory cell 100C of FIG. 1C, such that gate structures 304a1 and 304b1 are the corresponding gates of PMOS transistors PU0 and PU1, and gate structures 304a2 and 304b2 are the corresponding gates of NMOS transistors PG2 and PG3.

Other quantities or configurations of at least the set of gates 304, gate structures 304a1, 304a2, 304b1 or 304b2 are within the scope of the present disclosure.

Integrated circuit 300 further includes conductive structures 310b, 310c, 310d, 310e and 310f (collectively referred to as a "set of contacts 310"). Set of contacts 310 extends in the second direction Y. The set of contacts 310 is over the set of active regions 303, the set of active regions 305, the first well 301 and the second well 302. The set of contacts 310 is located on the second level of integrated circuit 300 or 500. In some embodiments, the second level of integrated circuit 300 or 500 is referred to as the metal diffusion (MD) level.

The set of contacts 310 is electrically coupled to the set of active regions 303 or 305 of integrated circuit 300 or 500. In some embodiments, the set of contacts 310 electrically couples the set of active regions 303 or 305 of integrated circuit 300 or 500 to upper levels (e.g., M0, M1 or M2) of integrated circuit 300 or 500.

Conductive structures 310a, 310b, 310c, 310d electrically couple corresponding vias 314a, 314b, 314g, 314h to corresponding active regions 303a1, 303b2, 305a1, 305b2. Conductive structures 310e, 310f electrically couple corresponding active regions 303a2, 303b1 to corresponding active regions 305a2, 305b1. Conductive structures 310e, 310f electrically couple corresponding vias 314e, 314d to corresponding conductive structures 312c, 312b (M0 level). Other quantities or configurations of the set of contacts 310 are within the scope of the present disclosure.

Integrated circuit 300 further includes conductive structures 312a, 312b, 312c, 312d, 312e and 312f (collectively referred to as a "set of conductive structures 312"). Set of conductive structures 312 extends in the first direction X. The set of conductive structures 312 is over the set of contacts 310, the set of gate structures 304, the set of active regions 303, the set of active regions 305, the first well 301 and the second well 302 of integrated circuit 300 or 500. The set of conductive structures 312 is located on a third level of integrated circuit 300 or 500. The third level of integrated circuit 300 or 500 is above the first level and the second level of integrated circuit 300 or 500. In some embodiments, the third level of integrated circuit 300 or 500 is referred to as the metal zero (M0) level.

The set of conductive structures 312 electrically couples the set of active regions 303 or 305 to upper levels (e.g., M1 or M2) of integrated circuit 300 or 500. In some embodiments, the set of conductive structures 312 electrically couples the set of gates 304 to upper levels (e.g., M1 or M2) of integrated circuit 300 or 500.

Conductive structure 312a electrically couples conductive structure 310a to conductive structure 310b by vias 314a and 314b. Conductive structure 312b electrically couples conductive structure 310f to gate structure 304a1 by vias 314c and 314d. Conductive structure 312c electrically couples conductive structure 310e to gate structure 304b1 by vias 314e and 314f.

Conductive structure 312d electrically couples conductive structure 310c to upper layers (e.g., conductive structure 318a) by vias 314g and 320a. Conductive structure 312e electrically couples conductive structure 310d to upper layers (e.g., conductive structure 318e) by vias 314h and 320e.

Conductive structure 312f electrically couples gate structure 304a2 to gate structure 304b2 by vias 314i and 314j. Other quantities or configurations of the set of conductive structures 312 are within the scope of the present disclosure.

Integrated circuit 300 further includes vias 314a, 314b, 314c, 314d, 314e, 314f, 314g, 314h, 314i and 314j (collectively referred to as a "set of vias 314") between the set of conductive structures 312 and either the set of conductive structures 310 or the set of gate structures 304 of integrated circuit 300 or 500. The set of vias 314 electrically couple the set of conductive structures 312 to the set of conductive structures 310 or the set of gate structures 304 of integrated circuit 300 or 500.

In some embodiments, one or more vias of the set of vias 314 is located where one or more conductive structures of the set of conductive structures 312 is over one or more of the set of conductive structures 310 or the set of gate structures 304 of integrated circuit 300 or 500.

Vias 314a, 314b electrically couple conductive structure 312a to corresponding conductive structures 310a, 310b. Vias 314c, 314f electrically couple corresponding conductive structures 312b, 312c to corresponding gate structures 304a2, 304b2. Vias 314d, 314e electrically couple corresponding conductive structures 312b, 312c to corresponding conductive structures 310f, 310e. Vias 314g, 314h electrically couples corresponding conductive structures 312d, 312e to corresponding conductive structures 310c, 310d.

Set of vias 314 is in the via over diffusion (VD) level or the via over gate (VG) level of integrated circuit 300 or 500. The VG or VD level of integrated circuit 300 or 500 is between the second level and the third level. In some embodiments, vias 314c, 314f, 314i and 314j are in the VG level of integrated circuit 300 or 500. In some embodiments, vias 314a, 314b, 314d, 314e, 314g and 314h are in the VD level of integrated circuit 300 or 500. Other quantities or configurations of the set of vias 314 are within the scope of the present disclosure.

Integrated circuit 300 further includes conductive structures 318a, 318b, 318c, 318d and 318e (collectively referred to as a "set of conductive structures 318"). Set of conductive structures 318 extends in the second direction Y. The set of conductive structures 318 is over the set of vias 320, set of conductive structures 312, the set of contacts 310, the set of gate structures 304, the set of active regions 303, the set of active regions 305, the first well 301 and the second well 302 of integrated circuit 300 or 500. The set of conductive structures 318 is located on a fourth level of integrated circuit 300 or 500. The fourth level of integrated circuit 300 or 500 is above the first level, the second level and the third level of integrated circuit 300 or 500. In some embodiments, the fourth level of integrated circuit 300 or 500 is referred to as the metal zero (M0) level.

The set of conductive structures 318 electrically couples the set of conductive structures 312 to upper levels (e.g., the set of conductive structures 322 (M1)) of integrated circuit 300 or 500.

Conductive structure 318a corresponds to at least a portion of the bit line BL of memory cell 100B of FIG. 1B or of memory cell 100C of FIG. 1C.

Together, conductive structures 318b and 318d correspond to the word line WL of memory cell 100B of FIG. 1B or memory cell 100C of FIG. 1C.

Conductive structure 318e corresponds to at least a portion of the bit line bar BLB of memory cell 100B of FIG. 1B or of memory cell 100C of FIG. 1C.

In some embodiments, integrated circuit 300 corresponds to memory cell 100B of FIG. 1B, and conductive structure 318c is electrically coupled to a reference supply voltage VSS. In some embodiments, integrated circuit 300 corresponds to memory cell 100C of FIG. 1C, and conductive structure 318c is electrically coupled to a supply voltage VDD. Other quantities or configurations of the set of conductive structures 318 are within the scope of the present disclosure.

Integrated circuit 300 further includes vias 320a, 320b, 320c, 320d and 320e (collectively referred to as a "set of vias 320") between the set of conductive structures 318 and the set of conductive structures 312 of integrated circuit 300 or 500. The set of vias 320 electrically couple the set of conductive structures 318 to the set of conductive structures 312 of integrated circuit 300 or 500. In some embodiments, one or more vias of the set of vias 320 is located where one or more conductive structures of the set of conductive structures 318 is over one or more of the set of conductive structures 312 of integrated circuit 300 or 500.

Vias 320a, 320e electrically couple corresponding conductive structures 318a, 318e to corresponding conductive structures 312d, 312e. Vias 320b, 320c electrically couple corresponding conductive structures 318b, 318d to corresponding conductive structures 312f. Via 320d electrically couples conductive structure 318c to conductive structure 312a.

Set of vias 320 is in the via zero (V0) level of integrated circuit 300 or 500. The V0 level of integrated circuit 300 or 500 is between the third level and the fourth level. Other quantities or configurations of the set of vias 320 are within the scope of the present disclosure.

Integrated circuit 300 further includes conductive structures 322a, 322b, 322c, 322d and 322e (collectively referred to as a "set of conductive structures 322"). Set of conductive structures 322 extends in the first direction X. The set of conductive structures 322 is over the set of vias 326, set of vias 320, set of conductive structures 318, set of conductive structures 312, the set of contacts 310, the set of gate structures 304, the set of active regions 303, the set of active regions 305, the first well 301 and the second well 302 of integrated circuit 300 or 500. The set of conductive structures 322 is located on a fifth level of integrated circuit 300 or 500. The fifth level of integrated circuit 300 or 500 is above the first level, the second level, the third level and the fourth level of integrated circuit 300 or 500. In some embodiments, the fifth level of integrated circuit 300 or 500 is referred to as the metal one (M1) level.

The set of conductive structures 322 is electrically coupled to the set of conductive structures 312 and the other lower levels (e.g., M0, Poly, OD, etc.) of integrated circuit 300 or 500. In some embodiments, the set of conductive structures 322 is electrically coupled to other upper levels (not shown) of integrated circuit 300 or 500.

Conductive structure 322b and 318a corresponds to at least a portion of the bit line BL of memory cell 100B of FIG. 1B or of memory cell 100C of FIG. 1C. Conductive structure 322d and 318e corresponds to at least a portion of the bit line bar BLB of memory cell 100B of FIG. 1B or of memory cell 100C of FIG. 1C.

In some embodiments, integrated circuit 300 corresponds to memory cell 100B of FIG. 1B, and conductive structures 322a, 322c, 322e and 318c are electrically coupled to the reference supply voltage VSS. In some embodiments, integrated circuit 300 corresponds to memory cell 100C of FIG. 1C, and conductive structures 322a, 322c, 322e and 318c are electrically coupled to the supply voltage VDD. Other quantities or configurations of the set of conductive structures 322 are within the scope of the present disclosure.

Integrated circuit 300 further includes vias 326a, 326b, 326c, 326d and 326e (collectively referred to as a "set of vias 326") between the set of conductive structures 322 and the set of conductive structures 318 of integrated circuit 300 or 500. The set of vias 326 electrically couple the set of conductive structures 322 to the set of conductive structures 318 of integrated circuit 300 or 500. In some embodiments, one or more vias of the set of vias 326 is located where one or more conductive structures of the set of conductive structures 322 is over one or more of the set of conductive structures 318 of integrated circuit 300 or 500.

Vias 326a, 326e electrically couple corresponding conductive structures 322b, 322d to corresponding conductive structures 318a, 318e. Vias 326b, 326c, 326d electrically couple corresponding conductive structures 322e, 322c, 322a to conductive structure 318c.

Set of vias 326 is in the via one (V1) level of integrated circuit 300 or 500. The V1 level of integrated circuit 300 or 500 is between the fourth level and the fifth level. Other quantities or configurations of the set of vias 326 are within the scope of the present disclosure.

In some embodiments, at least one conductive structure of the set of contacts 310 or at least one conductive structure of the set of conductive structures 312, 318 or 322 is a conductive material including copper, aluminum, alloys thereof or other suitable conductive materials, that is formed in one or more metallization layers by one or more of a physical vapor deposition process, a chemical vapor deposition process, a plating process, or other suitable processes.

In some embodiments, at least one via of the set of vias 314, 320 or 326 is a metal line, a via, a through silicon via (TSV), an inter-level via (ILV), a slot via, an array of vias, or another suitable conductive line. In some embodiments, at least one via of the set of vias 314, 320 or 326 includes copper, aluminum, nickel, titanium, tungsten, cobalt, carbon, alloys thereof or another suitable conductive material, that is formed in one or more metallization layers by one or more of a physical vapor deposition process, a chemical vapor deposition process, a plating process, or other suitable processes. In some embodiments, at least one via of the set of vias 314, 320 or 326 includes one or more conductive line segments. Other configurations, materials or quantities of the set of vias 314, 320 or 326 are within the scope of the present disclosure.

In some embodiments, integrated circuit 300 or 500 (FIG. 5) occupies less area than other integrated circuits. In some embodiments, by occupying less area than other integrated circuits, integrated circuit 300 or 500 is utilized as part of a memory macro 100A that is denser compared with other approaches. In some embodiments, by being utilized as part of a denser memory macro 100A or memory cell array, memory macro 100A has a larger memory capacity than other approaches.

In some embodiments, by using conductive structures 322b and 322d between conductive structures 322a, 322c, 322e results in integrated circuit 300 having better electromagnetic shielding than other approaches. In some embodiments, by providing better electromagnetic shielding results in integrated circuit 300 having less cross talk than other approaches.

Layout Design

FIGS. 4A-4B are diagrams of a layout design 400, in accordance with some embodiments.

Layout design 400 is a variation of layout design 200 of FIGS. 2A-2C. For example, layout design 400 has bit line layout patterns and bit line bar layout patterns with a greater width than layout design 200. Components that are the same or similar to those in one or more of FIGS. 2A-2C are given the same reference numbers, and detailed description thereof is thus omitted.

Layout design 400 is a layout diagram of memory cell 100B of FIG. 1B or memory cell 100C of FIG. 1C. Layout design 400 is usable to manufacture memory cell 100B or 100C. Layout design 400 includes portion 200A (FIG. 2A) and a portion 400A (FIG. 4A). For ease of illustration, layout design 400 of FIG. 4A does not include portion 200A. Layout design 400, as shown in FIG. 4B, includes portion 200A of FIG. 2A and portion 400A of FIG. 4A.

In comparison with layout design 200 of FIGS. 2A-2C, layout design 400 does not include conductive feature layout patterns 222a and 222e, and via layout patterns 226b and 226d.

In comparison with layout design 200 of FIGS. 2A-2C, conductive feature layout pattern 422d of layout design 400 replaces conductive feature layout pattern 222a, and conductive feature layout pattern 422b of layout design 400 replaces conductive feature layout pattern 222b.

Conductive feature layout patterns 422d and 422b are similar to corresponding conductive feature layout patterns 222d and 222b, and similar detailed description is therefore omitted. In some embodiments, conductive feature layout patterns 422d and 422b are usable to manufacture corresponding conductive structures 522d and 522b (FIG. 5).

Conductive feature layout patterns 422d or 422b has a larger width in the second direction Y than a width of corresponding conductive feature layout pattern 222d or 222b in the second direction Y. By increasing the width of conductive feature layout patterns 422d, 422b, conductive feature layout patterns 422d, 422b are usable to manufacture corresponding bit lines BL (e.g., conductive structure 522b in FIG. 5) and bit line bars BLB (e.g., conductive structure 522d in FIG. 5) having less resistance than approaches with a smaller width in the second direction Y. In some embodiments, by removing conductive feature layout patterns 222a and 222e, and via layout patterns 226b and 226d, layout design 400 has increased routing resources usable for other metal layers.

Other configurations of conductive feature layout patterns 422d or 422b are within the scope of the present disclosure. For example, in some embodiments, the width or length of at least conductive feature layout patterns 422d or 422b is changed to overlap or expose different layout patterns than that shown in FIG. 4.

Integrated Circuit—Cross-Sectional Views

FIG. 5 is a cross-sectional view of an integrated circuit 500 corresponding to layout design 400 as intersected by plane J-J'. FIG. 5 is a variation of FIG. 3H of integrated circuit 300.

Integrated circuit 500 is manufactured by layout design 400. Integrated circuit 500 is a structural implementation of memory cell 100B or 100C.

Integrated circuit 500 is a variation of integrated circuit 300. In comparison with integrated circuit 300, integrated circuit 500 does not include conductive structures 322a and 322e, and vias 326b and 326d.

In comparison with integrated circuit 300 of FIGS. 3A-3I, conductive structure 522b of integrated circuit 500 replaces conductive structure 322b, and conductive structure 522d of integrated circuit 500 replaces conductive structure 322d.

Conductive structures 522b and 522d are similar to corresponding conductive structures 322b and 322d, and similar detailed description is therefore omitted.

Conductive structures 522b or 522d has a larger width in the second direction Y than a width of corresponding conductive structures 322b or 322d in the second direction Y. By increasing the width of conductive structures 522b and 522d, bit line BL (e.g., conductive structure 522b in FIG. 5) and bit line bar BLB (e.g., conductive structure 522d in FIG. 5) have less resistance than approaches with a smaller width in the second direction Y. In some embodiments, by removing conductive structures 322a and 322e, and vias 326b and 326d, integrated circuit 500 has increased routing resources usable for other metal layers.

Other configurations of conductive structures 522b or 522d are within the scope of the present disclosure. For example, in some embodiments, the width or length of at least conductive structure 522b or 522d is changed to overlap or expose different portions of integrated circuit 500 than that shown in FIG. 5.

For brevity, a single cross-sectional figure (e.g., FIG. 5) of integrated circuit 500 is shown. However, it is understood that integrated circuit 500 includes additional cross-sectional figures (not shown) that are similar to the cross-sectional figures of integrated circuit 300 shown in FIGS. 3A-3I. For example, each of the cross-sectional views of integrated circuit 300 can be modified, similar to FIG. 5, to not include conductive structures 322a and 322e, and vias 326b and 326d, and conductive structure 522b replaces conductive structure 322b, and conductive structure 522d replaces conductive structure 322d.

Method

FIG. 6A is a flowchart of a method 600A of forming or manufacturing an IC in accordance with some embodiments.

It is understood that additional operations may be performed before, during, and/or after the method 600A depicted in FIG. 6A, and that some other processes may only be briefly described herein. In some embodiments, the method 600A is usable to form integrated circuits, such as memory macro 100A (FIG. 1A), memory cell 100B (FIG. 1B), memory cell 100C (FIG. 1C), IC structure 300 (FIGS. 3A-3I) or IC structure 500 (FIG. 5). In some embodiments, the method 600A is usable to form integrated circuits having similar relationships as one or more of layout designs 200 or 400 (FIGS. 2A-2C or 4A-4B).

Figure 7:
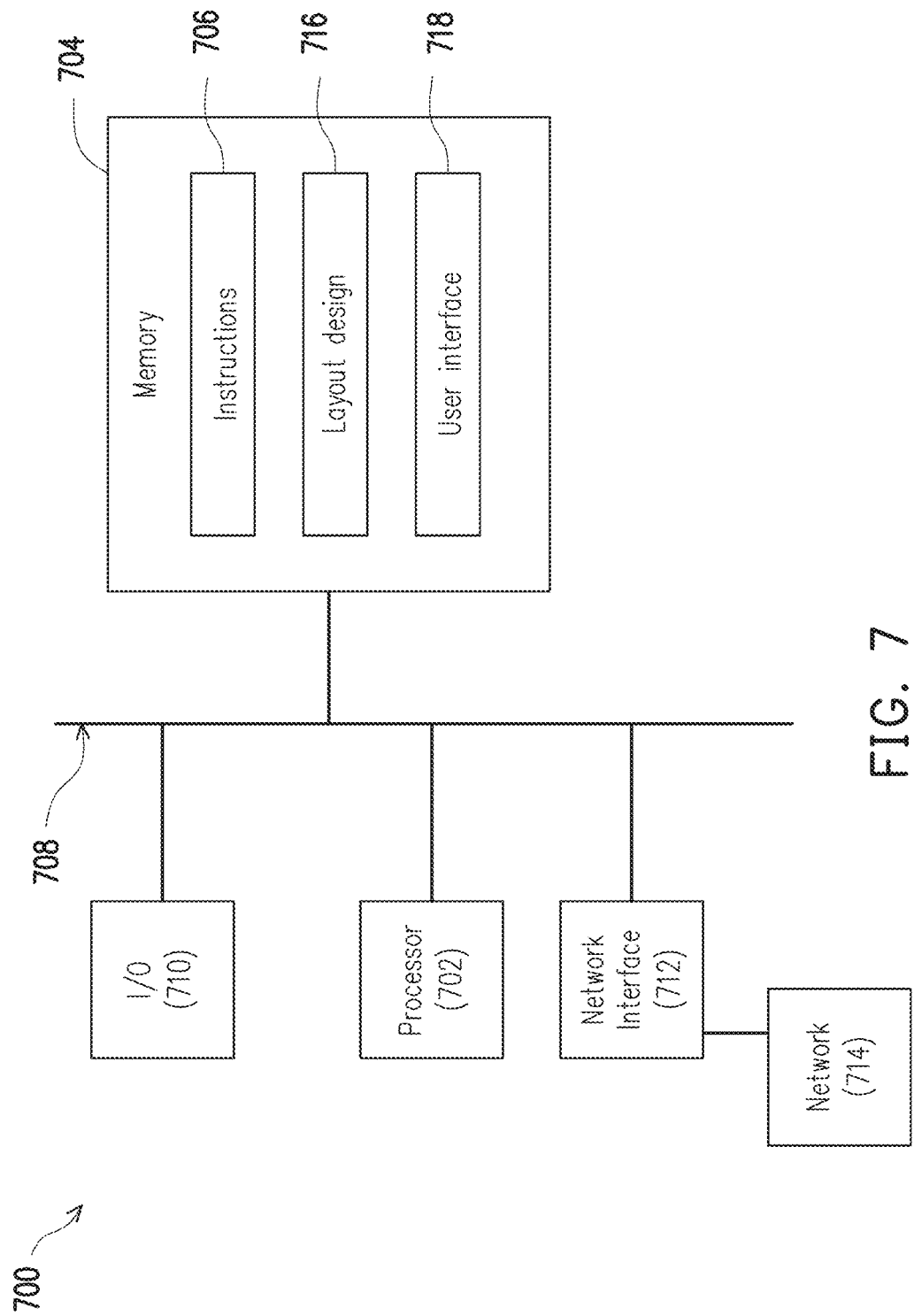
FIG. 7 is a block diagram of a system for designing an integrated circuit layout design, in accordance with some embodiments.

In operation 602 of method 600A, a layout design 200 or 400 of a memory array circuit (e.g., memory cell 100B, 100C) is generated. Operation 602 is performed by a processing device (e.g., processor 702 (FIG. 7)) configured to execute instructions for generating a layout design 200, 400 or 716 (FIG. 7). In some embodiments, the layout design 200, 400 or 716 is a graphic database system (GDSII) file format.

In operation 604 of method 600A, the memory array circuit (e.g., memory macro 100A, memory cell 100B or 100C) is manufactured based on layout design 200, 400 or 716. In some embodiments, operation 604 of method 600A comprises manufacturing at least one mask based on the layout design 200, 400 or 716, and manufacturing the memory array circuit based on the at least one mask. In some embodiments, the memory array circuit of operation 602 or 604 comprises memory cell 100B (FIG. 1B), memory cell 100C (FIG. 1C), IC structure 300 (FIGS. 3A-3I) or IC structure 500 (FIG. 5).

Figure 6B:
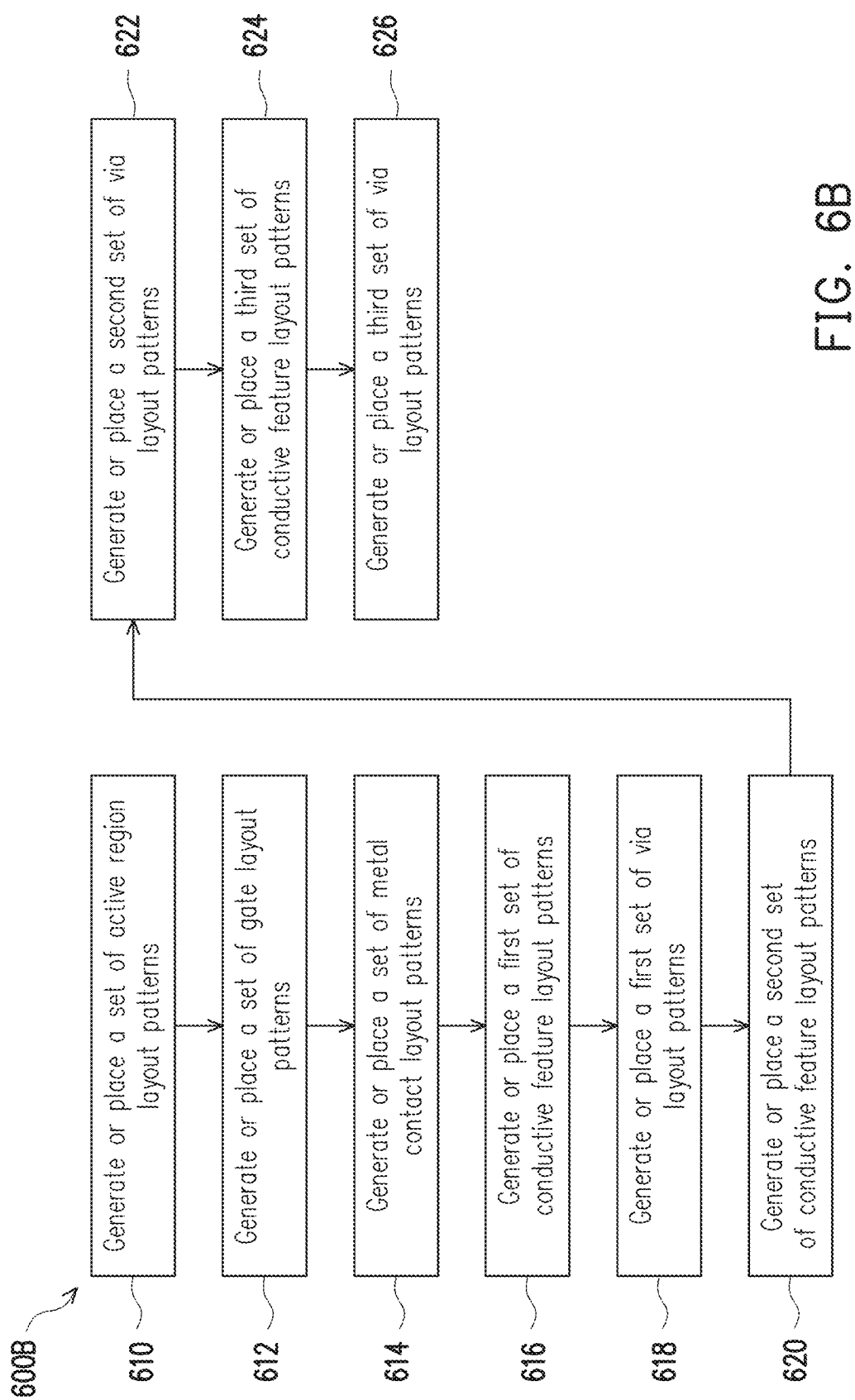
FIG. 6B is a flowchart of a method of generating a layout design of a memory array circuit, in accordance with some embodiments.

FIG. 6B is a flowchart of a method 600B of generating a layout design of a memory array circuit in accordance with some embodiments. It is understood that additional operations may be performed before, during, and/or after the method 600B depicted in FIG. 6B, and that some other processes may only be briefly described herein. In some embodiments, the method 600B is usable to generate one or more of layout designs 200 or 400 (FIGS. 2A-2C & 4A-4B) of memory cell 100B (FIG. 1B), memory cell 100C (FIG. 1C), IC structure 300 (FIGS. 3A-3I) or IC structure 500 (FIG. 5).

In operation 610 of method 600B, a set of active region layout patterns 212a or 212b is generated. In some embodiments, generating the set of active region layout patterns 212a or 212b are usable or correspond to fabricating a set of active regions 303 or 305 of integrated circuit 300 or 500.

In some embodiments, the set of active regions 303 or 305 of integrated circuit 300 or 500 include the active regions of a first pull down transistor (NMOS transistor PD0), a second pull down transistor (NMOS transistor PD1) and a first pass gate transistor (PMOS transistor PG0), a second pass gate transistor (PMOS transistor PG1). In some embodiments, the set of active regions 303 or 305 of integrated circuit 300 or 500 include the active regions of a first pull up transistor (PMOS transistor PU0), a second pull up transistor (PMOS transistor PU1) and a first pass gate transistor (NMOS transistor PG2), a second pass gate transistor (NMOS transistor PG3).

In some embodiments, each of the layout patterns of the set of active region layout patterns 212a, 212b is separated from an adjacent layout pattern of the set of active region layout patterns 212a, 212b in the second direction Y by a first pitch. In some embodiments, the set of active region layout patterns 212a, 212b extend in the first direction X different from the first direction and being located on a first layout level (e.g., active region or well).

In some embodiments, generating the set of active region layout patterns 312a, 412a of operation 610 includes generating active region layout pattern 202a1, active region layout pattern 202a2, active region layout pattern 202b1 and active region layout pattern 202b2.

In some embodiments, operation 610 includes placing the set of active region layout patterns 312a, 412a of on the first layout level (e.g., active region or well). In some embodiments, the first layout level corresponds to the active region of layout design 200 or 400.

In operation 612, a set of gate layout patterns 204 is generated. In some embodiments, the set of gate layout patterns 204 corresponds to fabricating a set of gate structures 304 of memory cell 100B-100C or integrated circuit 300 or 500.

In some embodiments, the set of gate layout patterns 204 of method 1000 includes one or more of gate layout patterns 204a, 204b or 204c. In some embodiments, operation 612 includes placing the set of gate layout patterns 202 on the second layout level (e.g., POLY).

In operation 614, a set of metal contact layout patterns 210 is generated. In some embodiments, the set of metal contact layout patterns 210 corresponds to fabricating a set of metal contacts 310 of memory cell 100B-100C or integrated circuit 300 or 500.

In some embodiments, in operation 614, metal contact layout pattern 210a and 210b overlaps the cell boundary of layout design 200 or 400 and active region layout pattern 202a.

In some embodiments, in operation 614, metal contact layout pattern 210a, 210b, 210c and 210d are used to manufacture corresponding metal contacts 310a, 310b, 310c and 310d. In some embodiments, metal contact 310a is electrically coupled to a source of the first pull down transistor (NMOS transistor PD0). In some embodiments, metal contact 310b is electrically coupled to a source of the second pull down transistor (NMOS transistor PD1).

In some embodiments, metal contact 310a is electrically coupled to a source of the first pull up transistor (PMOS transistor PU0). In some embodiments, metal contact 310b is electrically coupled to a source of the second pull up transistor (PMOS transistor PU1).

In some embodiments, metal contact 310c is electrically coupled to a source or drain of the first pass gate transistor (PMOS transistor PG0). In some embodiments, metal contact 310d is electrically coupled to a source or drain of the second pass gate transistor (PMOS transistor PG1).

In some embodiments, metal contact 310c is electrically coupled to a source or drain of the first pass gate transistor (NMOS transistor PG2). In some embodiments, metal contact 310d is electrically coupled to a source or drain of the second pass gate transistor (NMOS transistor PG3).

In some embodiments, the set of metal contact layout patterns 210 of method 600B includes one or more of conductive feature layout patterns 210a, 210b, 210c, 210d, 210e or 210f. In some embodiments, operation 614 includes placing the set of metal contact layout patterns 210 on the third layout level (e.g., MD).

In operation 616, a first set of conductive feature layout patterns 212 is generated. In some embodiments, the first set of conductive feature layout patterns of operation 616 includes the set of conductive feature layout patterns 212. In some embodiments, the set of conductive feature layout patterns 212 corresponds to fabricating a set of conductive structures 312 of memory cell 100B-100C or integrated circuit 300 or 500.

In some embodiments, the set of conductive feature layout patterns 212 of method 600B includes one or more of conductive feature layout patterns 212a, 212b, 212c, 212d, 212e or 212f. In some embodiments, operation 616 includes placing the set of conductive feature layout patterns 212 on the fourth layout level (e.g., M0).

In operation 618, a first set of via layout patterns is generated. In some embodiments, the first set of via layout patterns of operation 618 includes set of via layout patterns 214. In some embodiments, the set of via layout patterns 214 corresponds to fabricating a set of vias 314 of memory cell 100B-100C or integrated circuit 300 or 500.

In some embodiments, the set of via layout patterns 214 of method 600B includes one or more of via layout patterns 214a, 214b, 214c, 214d, 214e, 214f, 214g, 214h or 214i. In some embodiments, operation 618 includes placing the set of vias between the set of metal contact layout patterns 210 and the set of conductive feature layout patterns 212. In some embodiments, operation 618 includes placing the set of vias between the third layout level (e.g., MD) and the fourth layout level (e.g., M0). In some embodiments, operation 618 includes placing the set of vias 214 on the VG or VD layout level.

In operation 620, a second set of conductive feature layout patterns is generated. In some embodiments, the second set of conductive feature layout patterns of operation 620 includes the set of conductive feature layout patterns 218. In some embodiments, the set of conductive feature layout patterns 218 corresponds to fabricating a set of conductive structures 318 of memory cell 100B-100C or integrated circuit 300 or 500.

In some embodiments, the set of conductive feature layout patterns 218 of method 600B includes one or more of conductive feature layout patterns 218a, 218b, 218c, 218d or 218e. In some embodiments, operation 620 includes placing the set of conductive feature layout patterns 218 on the fifth layout level (e.g., M1).

In operation 622, a second set of via layout patterns is generated. In some embodiments, the second set of via layout patterns of operation 622 includes set of via layout patterns 220. In some embodiments, the set of via layout patterns 220 corresponds to fabricating a set of vias 320 of memory cell 100B-100C or integrated circuit 300 or 500.

In some embodiments, the set of via layout patterns 220 of method 600B includes one or more of via layout patterns 220a, 220b, 220c, 220d or 220e. In some embodiments, operation 622 includes placing the set of via layout patterns 220 between the set of conductive feature layout patterns 218 and the set of conductive feature layout patterns 212. In some embodiments, operation 622 includes placing the set of vias between the fourth layout level (e.g., M0) and the fifth layout level (e.g., M1). In some embodiments, operation 622 includes placing the set of vias 220 on the V0 layout level.

In operation 624, a third set of conductive feature layout patterns is generated. In some embodiments, the third set of conductive feature layout patterns of operation 624 includes the set of conductive feature layout patterns 222. In some embodiments, the set of conductive feature layout patterns 222 corresponds to fabricating a set of conductive structures 322 of memory cell 100B-100C or integrated circuit 300 or 500.

In some embodiments, the set of conductive feature layout patterns 222 of method 600B includes one or more of conductive feature layout patterns 222a, 222b, 222c, 222d, 222e, 422b or 422d. In some embodiments, operation 624 includes placing the set of conductive feature layout patterns 222 on the sixth layout level (e.g., M2).

In operation 626, a third set of via layout patterns is generated. In some embodiments, the third set of via layout patterns of operation 626 includes set of via layout patterns 226. In some embodiments, the set of via layout patterns 226 corresponds to fabricating a set of vias 326 of memory cell 100B-100C or integrated circuit 300 or 500.

In some embodiments, the set of via layout patterns 226 of method 600B includes one or more of via layout patterns 226a, 226b, 226c, 226d or 226e. In some embodiments, operation 626 includes placing the set of via layout patterns 226 between the set of conductive feature layout patterns 218 and the set of conductive feature layout patterns 222. In some embodiments, operation 626 includes placing the set of vias between the fifth layout level (e.g., M1) and the sixth layout level (e.g., M2). In some embodiments, operation 626 includes placing the set of vias 226 on the V1 layout level.

In some embodiments, one or more of layout design 200 or 400 is a standard cell. In some embodiments, one or more of operations 610-626 is not performed.

One or more of the operations of methods 600A-600B is performed by a processing device configured to execute instructions for manufacturing a memory array circuit, such as memory macro 100A, a memory cell, such as memory cell 100B or 100C, or an IC, such as IC structure 300 or 500. In some embodiments, one or more operations of methods 600A-600B is performed using a same processing device as that used in a different one or more operations of methods 600A-600B. In some embodiments, a different processing device is used to perform one or more operations of methods 600A-600B from that used to perform a different one or more operations of methods 600A-600B.

FIG. 7 is a schematic view of a system 700 for designing an IC layout design in accordance with some embodiments. In some embodiments, system 700 generates or places one or more IC layout designs described herein. System 700 includes a hardware processor 702 and a non-transitory, memory 704 encoded with, i.e., storing, the computer program code 706, i.e., a set of executable instructions. Memory 704 is configured for interfacing with manufacturing machines for producing the integrated circuit. The processor 702 is electrically coupled to the memory 704 via a bus 708. The processor 702 is also electrically coupled to an I/O interface 710 by bus 708. A network interface 712 is also electrically connected to the processor 702 via bus 708. Network interface 712 is connected to a network 714, so that processor 702 and memory 704 are capable of connecting to external elements via network 714. The processor 702 is configured to execute the computer program code 706 encoded in the memory 704 in order to cause system 700 to be usable for performing a portion or all of the operations as described in method 600A or 600B.

In some embodiments, the processor 702 is a central processing unit (CPU), a multi-processor, a distributed processing system, an application specific integrated circuit (ASIC), and/or a suitable processing unit.

In some embodiments, the memory 704 is an electronic, magnetic, optical, electromagnetic, infrared, and/or a semiconductor system (or apparatus or device). For example, the memory 704 includes a semiconductor or solid-state memory, a magnetic tape, a removable computer diskette, a random access memory (RAM), a read-only memory (ROM), a rigid magnetic disk, and/or an optical disk. In some embodiments, memory 704 is a computer readable storage medium. In some embodiments using optical disks, the memory 704 includes a compact disk-read only memory (CD-ROM), a compact disk-read/write (CD-R/W), and/or a digital video disc (DVD).

In some embodiments, the storage medium 704 stores the computer program code 706 configured to cause system 700 to perform method 600A or 600B. In some embodiments, the storage medium 704 also stores information needed for performing method 600A or 600B as well as information generated during performing method 600A or 600B, such as layout design 716 and user interface 718, and/or a set of executable instructions to perform the operation of method 600A or 600B. In some embodiments, layout design 716 comprises one or more of layout designs 200 or 400.

In some embodiments, the storage medium 704 stores instructions (e.g., computer program code 706) for interfacing with manufacturing machines. The instructions (e.g., computer program code 706) enable processor 702 to generate manufacturing instructions readable by the manufacturing machines to effectively implement method 600A or 600B during a manufacturing process.

System 700 includes I/O interface 710. I/O interface 710 is coupled to external circuitry. In some embodiments, I/O interface 710 includes a keyboard, keypad, mouse, trackball, trackpad, and/or cursor direction keys for communicating information and commands to processor 702.

System 700 also includes network interface 712 coupled to the processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interface such as ETHERNET, USB, or IEEE-1394. In some embodiments, method 600A or 600B is implemented in two or more systems 700, and information such as layout design, and user interface are exchanged between different systems 700 by network 714.

System 700 is configured to receive information related to a layout design through I/O interface 710 or network interface 712. The information is transferred to processor 702 by bus 708 to determine a layout design for producing an IC structure, such as IC structure 300 or 500. The layout design is then stored in memory 704 as layout design 716. System 700 is configured to receive information related to a user interface through I/O interface 710 or network interface 712. The information is stored in memory 704 as user interface 718.

In some embodiments, method 600A or 600B is implemented as a standalone software application for execution by a processor. In some embodiments, method 600A or 600B is implemented as a software application that is a part of an additional software application. In some embodiments, method 600A or 600B is implemented as a plug-in to a software application. In some embodiments, method 600A or 600B is implemented as a software application that is a portion of an EDA tool. In some embodiments, method 600A or 600B is implemented as a software application that is used by an EDA tool. In some embodiments, the EDA tool is used to generate a layout of the integrated circuit device. In some embodiments, the layout is stored on a non-transitory computer readable medium or memory 704. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 600A is implemented by a manufacturing device to manufacture an integrated circuit (e.g., memory cell 100B or 100C, IC structure 300 or 500) using a set of masks manufactured based on one or more layout designs (e.g., layout design 200 or 400) generated by system 700.

System 700 of FIG. 7 generates layout designs (e.g., layout design 200 or 400) of memory macro 100A, memory cell 100B or 100C or IC structure 300 or 500 that are smaller than other approaches.

Figure 8:
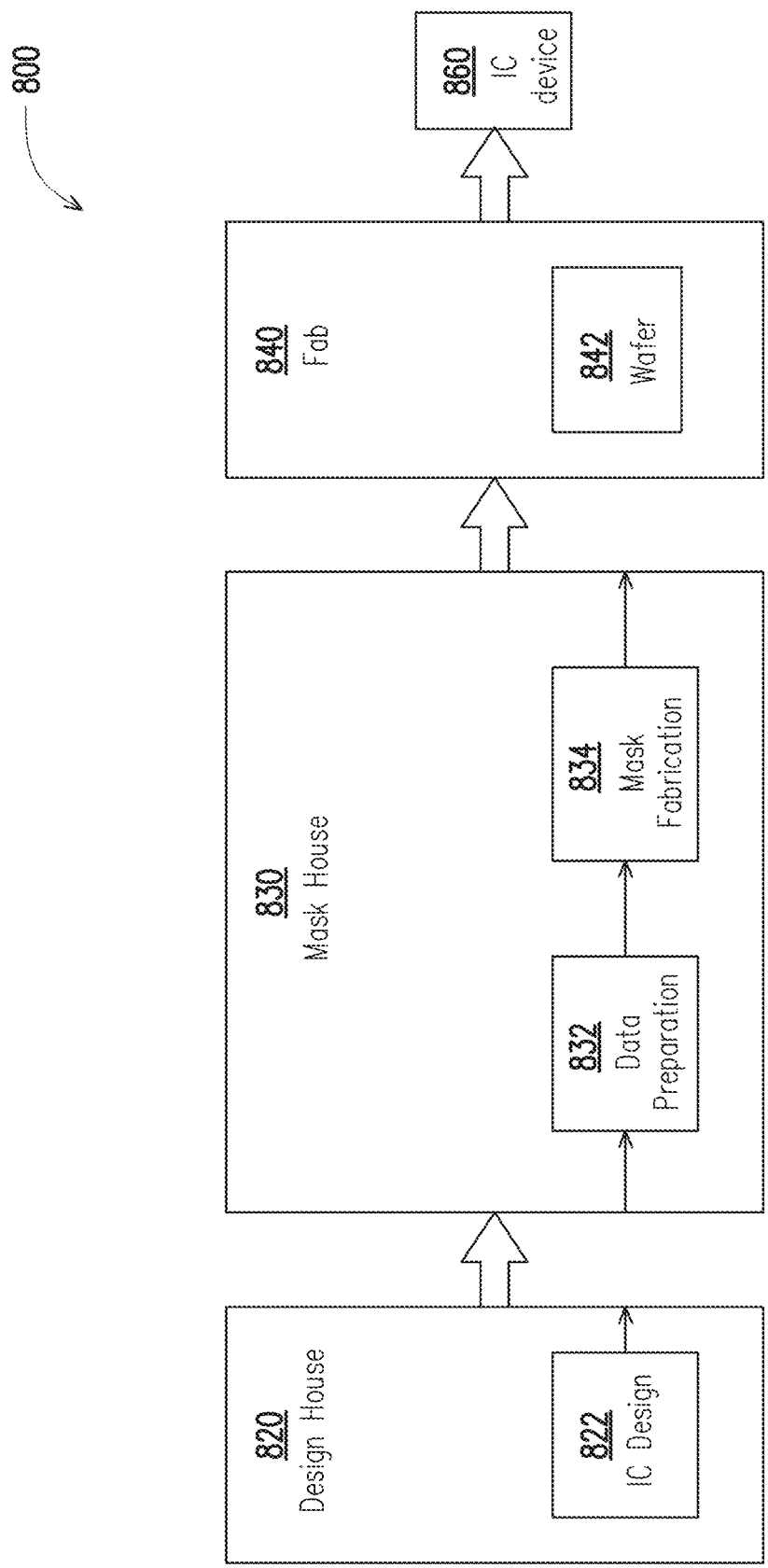
FIG. 8 is a block diagram of an integrated circuit (IC) manufacturing system and an IC manufacturing flow associated therewith, in accordance with some embodiments.

FIG. 8 is a block diagram of an integrated circuit (IC) manufacturing system 800, and an IC manufacturing flow associated therewith, in accordance with at least one embodiment of the present disclosure.

In FIG. 8, IC manufacturing system 800 includes entities, such as a design house 820, a mask house 830, and an IC manufacturer/fabricator ("fab") 840, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 840 is owned by a single larger company. In some embodiments, two or more of design house 820, mask house 830, and IC fab 840 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860. The various layers combine to form various IC features. For example, a portion of IC design layout 822 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout 822. The design procedure includes one or more of logic design, physical design or place and route. IC design layout 822 is presented in one or more data files having information of the geometrical patterns. For example, IC design layout 822 can be expressed in a GDSII file format or DFII file format.

Mask house 830 includes data preparation 832 and mask fabrication 834. Mask house 830 uses IC design layout 822 to manufacture one or more masks to be used for fabricating the various layers of IC device 860 according to IC design layout 822. Mask house 830 performs mask data preparation 832, where IC design layout 822 is translated into a representative data file ("RDF"). Mask data preparation 832 provides the RDF to mask fabrication 834. Mask fabrication 834 includes a mask writer. A mask writer converts the RDF to an image on a substrate, such as a mask (reticle) or a semiconductor wafer. The IC design layout 822 is manipulated by mask data preparation 832 to comply with particular characteristics of the mask writer and/or requirements of IC fab 840. In FIG. 8, mask data preparation 832 and mask fabrication 834 are illustrated as separate elements. In some embodiments, mask data preparation 832 and mask fabrication 834 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout 822 to compensate for limitations during mask fabrication 834, which may undo part of the modifications performed by OPC in order to meet mask creation rules.

In some embodiments, mask data preparation 832 includes lithography process checking (LPC) that simulates processing that will be implemented by IC fab 840 to fabricate IC device 860. LPC simulates this processing based on IC design layout 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 822.

It should be understood that the above description of mask data preparation 832 has been simplified for the purposes of clarity. In some embodiments, data preparation 832 includes additional features such as a logic operation (LOP) to modify the IC design layout 822 according to manufacturing rules. Additionally, the processes applied to IC design layout 822 during data preparation 832 may be executed in a variety of different orders.

After mask data preparation 832 and during mask fabrication 834, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 834 is used in a variety of processes. For example, such a mask(s) is used in an ion implantation process to form various doped regions in the semiconductor wafer, in an etching process to form various etching regions in the semiconductor wafer, and/or in other suitable processes.

IC fab 840 is an IC fabrication business that includes one or more manufacturing facilities for the fabrication of a variety of different IC products. In some embodiments, IC Fab 840 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 840 uses the mask (or masks) fabricated by mask house 830 to fabricate IC device 860. Thus, IC fab 840 at least indirectly uses IC design layout 822 to fabricate IC device 860. In some embodiments, a semiconductor wafer 842 is fabricated by IC fab 840 using the mask (or masks) to form IC device 860. Semiconductor wafer 842 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a method of forming a memory circuit. In some embodiments, the method includes generating, by a processor, a layout design of the memory circuit, and manufacturing the memory circuit based on the layout design. In some embodiments, the layout design has a cell boundary. In some embodiments, the generating of the layout design includes generating a first active region layout pattern corresponding to fabricating a first active region of a first pull down transistor, the first active region layout pattern extending in a first direction, and being located on a first level; generating a second active region layout pattern corresponding to fabricating a second active region of a first pass gate transistor, the second active region layout pattern extending in the first direction, being located on the first level, and being separated from the first active region layout pattern in a second direction different from the first direction; and generating a first metal contact layout pattern corresponding to fabricating a first metal contact, the first metal contact layout pattern extending in the second direction, overlapping the cell boundary of the memory circuit and the first active region layout pattern, and being located on a second level different from the first level, and the first metal contact electrically coupled to a source of the first pull down transistor.

Still another aspect of this disclosure relates to a method of forming a memory circuit. In some embodiments, the method includes generating, by a processor, a layout design of the memory circuit, and manufacturing the memory circuit based on the layout design, the memory circuit being a four transistor (4T) memory cell including at least the first pass gate transistor and the first pull up transistor. In some embodiments, the layout design has a cell boundary. In some embodiments, the generating of the layout design includes placing a first active region layout pattern on a first level, the first active region layout pattern corresponding to fabricating a first active region of a first pull down transistor, the first active region layout pattern extending in a first direction; placing a second active region layout pattern on the first level, the second active region layout pattern corresponding to fabricating a second active region of a first pass gate transistor, the second active region layout pattern extending in the first direction, and being separated from the first active region layout pattern in a second direction different from the first direction; and placing a first metal contact layout pattern on a second level different from the first level, the first metal contact layout pattern corresponding to fabricating a first metal contact, the first metal contact layout pattern extending in the second direction, extending from the first active region layout pattern to the second active region layout pattern, and the first metal contact electrically coupling a drain of the first pull down transistor to a drain of the first pass gate transistor.

Yet another aspect of this description relates to a memory cell. In some embodiments, the memory cell includes a first pull down transistor having a first active region extending in a first direction, and the first active region being located on a first level; a first pass gate transistor having a second active region extending in the first direction, the second active region being located on the first level, and being separated from the first active region in a second direction different from the first direction; a second pull down transistor; a second pass gate transistor coupled to the second pull down transistor; and a first metal contact extending in the second direction, and extending from the first active region to the second active region, the first metal contact being located on a second level different from the first level, the first metal contact electrically coupling a drain of the first pull down transistor to a drain of the first pass gate transistor. In some embodiments, the first pass gate transistor, the second pass gate transistor, the first pull down transistor and the second pull down transistor are part of a four transistor (4T) memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory circuit, the method comprising:
    generating, by a processor, a layout design of the memory circuit, the layout design having a cell boundary, wherein the generating of the layout design comprises:
        generating a first active region layout pattern corresponding to fabricating a first active region of a first pull down transistor, the first active region layout pattern extending in a first direction, and being located on a first level;
        generating a second active region layout pattern corresponding to fabricating a second active region of a first pass gate transistor, the second active region layout pattern extending in the first direction, being located on the first level, and being separated from the first active region layout pattern in a second direction different from the first direction; and
        generating a first metal contact layout pattern corresponding to fabricating a first metal contact, the first metal contact layout pattern extending in the second direction, overlapping the cell boundary of the memory circuit and the first active region layout pattern, and being located on a second level different from the first level, and the first metal contact electrically coupled to a source of the first pull down transistor; and
    manufacturing the memory circuit based on the layout design, the memory circuit being a four transistor (4T) memory cell including the first pass gate transistor, a second pass gate transistor, the first pull down transistor and a second pull down transistor.

2. The method of claim 1, wherein the generating the layout design further comprises:
    generating a third active region layout pattern corresponding to fabricating a third active region of the second pull down transistor, the third active region layout pattern extending in the first direction, being located on the first level, and being next to the first active region layout pattern;
    generating a fourth active region layout pattern corresponding to fabricating a fourth active region of the second pass gate transistor, the fourth active region layout pattern extending in the first direction, being located on the first level, being next to the second active region layout pattern, and being separated from the third active region layout pattern in the second direction; and
    generating a second metal contact layout pattern corresponding to fabricating a second metal contact, the second metal contact layout pattern extending in the second direction, overlapping the cell boundary of the memory cell and the third active region layout pattern, and being located on the second level, and the second metal contact electrically coupled to a source of the second pull down transistor.

3. The method of claim 2, wherein the generating the layout design further comprises:
    generating a third metal contact layout pattern corresponding to fabricating a third metal contact, the third metal contact layout pattern extending in the second direction, extending from the first active region layout pattern to the second active region layout pattern, the third metal contact layout pattern being located on the second level, and the third metal contact electrically coupling a drain of the first pull down transistor to a drain of the first pass gate transistor; and
    generating a fourth metal contact layout pattern corresponding to fabricating a fourth metal contact, the fourth metal contact layout pattern extending in the second direction, and extending from the third active region layout pattern to the fourth active region layout pattern, the fourth metal contact layout pattern being located on the second level, and the fourth metal contact electrically coupling a drain of the second pull down transistor to a drain of the second pass gate transistor.

4. The method of claim 3, wherein the generating the layout design further comprises:
generating a fifth metal contact layout pattern corresponding to fabricating a fifth metal contact, the fifth metal contact layout pattern extending in the second direction, being separated from the first metal contact layout pattern in the second direction, overlapping the cell boundary of the memory cell and the second active region layout pattern, and being located on the second level, and the fifth metal contact being electrically coupled to a source of the first pass gate transistor; and
generating a sixth metal contact layout pattern corresponding to fabricating a sixth metal contact, the sixth metal contact layout pattern extending in the second direction, being separated from the third metal contact layout pattern in the second direction, overlapping the cell boundary of the memory cell and the fourth active region layout pattern, and being located on the second level, and the sixth metal contact being electrically coupled to a source of the second pass gate transistor.

5. The method of claim 4, wherein the generating the layout design further comprises:
generating a set of gate layout patterns corresponding to fabricating a set of gates, the set of gate layout patterns comprising:
a first gate layout pattern extending in the second direction, overlapping the first active region layout pattern or the second active region layout pattern, and being located on the second level; and
a second gate layout pattern extending in the second direction, overlapping the third active region layout pattern or the fourth active region layout pattern, being separated from the first gate layout pattern in the first direction, and being located on the second level.

6. The method of claim 5, wherein the generating the layout design further comprises:
generating a cut feature layout pattern, the cut feature layout pattern being on the second level, extending in the first direction and overlapping the first gate layout pattern and the second gate layout pattern, and the cut feature layout pattern identifying a location of a removed portion of a gate of the set of gates.

7. The method of claim 5, wherein the generating the layout design further comprises:
generating a first set of conductive feature layout patterns corresponding to fabricating a first set of conductive structures, the first set of conductive feature layout patterns extending in the first direction and overlapping at least the first active region layout pattern, the second active region layout pattern, the third active region layout pattern, the fourth active region layout pattern or the set of gate layout patterns, each conductive feature layout pattern of the first set of conductive feature layout patterns being separated from an adjacent conductive feature layout pattern of the first set of conductive feature layout patterns in at least the first direction or the second direction, and being located on a third level different from the first level and the second level; and
generating a first set of via layout patterns corresponding to fabricating a first set of vias, the first set of via layout patterns being between the first set of conductive feature layout patterns and at least one of the first active region layout pattern, the second active region layout pattern s the third active region layout pattern, the fourth active region layout pattern or the set of gate layout patterns, the first set of vias coupling the first set of conductive structures to at least the first active region, the second active region, the third active region, the fourth active region or the set of gates, and at least one via layout pattern of the first set of via layout patterns being located where at least one conductive feature layout pattern of the first set of conductive feature layout patterns overlaps at least one of the first active region layout pattern, the second active region layout pattern, the third active region layout pattern, the fourth active region layout pattern or the set of gate layout patterns.

8. The method of claim 7, wherein the generating the layout design further comprises:
generating a second set of conductive feature layout patterns corresponding to fabricating a second set of conductive structures, the second set of conductive feature layout patterns extending in the second direction and overlapping at least the first active region layout pattern, the second active region layout pattern, the third active region layout pattern, the fourth active region layout pattern or the first set of conductive feature layout patterns, each conductive feature layout pattern of the second set of conductive feature layout patterns being separated from an adjacent layout pattern of the second set of conductive feature layout patterns in the first direction, and being located on a fourth level different from the first level, the second level and the third level; and
generating a second set of via layout patterns corresponding to fabricating a second set of vias, the second set of via layout patterns being between the second set of conductive feature layout patterns and the first set of conductive feature layout patterns, the second set of vias coupling the second set of conductive structures to the first set of conductive structures, and at least one via layout pattern of the second set of via layout patterns being located where at least one conductive feature layout pattern of the second set of conductive feature layout patterns overlaps at least one of the first set of conductive feature layout patterns.

9. The method of claim 8, wherein the generating the layout design further comprises:
generating a third set of conductive feature layout patterns corresponding to fabricating a third set of conductive structures, the third set of conductive feature layout patterns extending in the first direction and overlapping at least the second set of conductive feature layout patterns, each conductive feature layout pattern of the third set of conductive feature layout patterns being separated from an adjacent layout pattern of the third set of conductive feature layout patterns in the second direction, and being located on a fifth level different from the first level, the second level, the third level and the fourth level; and
generating a third set of via layout patterns corresponding to fabricating a third set of vias, the third set of via layout patterns being between the third set of conductive feature layout patterns and the second set of conductive feature layout patterns, the third set of vias coupling the third set of conductive structures to the second set of conductive structures, and at least one via layout pattern of the third set of via layout patterns being located where at least one conductive feature layout pattern of the third set of conductive feature layout patterns overlaps at least one of the second set of conductive feature layout patterns.

10. A method of forming a memory circuit, the method comprising:
generating, by a processor, a layout design of the memory circuit, the layout design having a cell boundary, wherein the generating of the layout design comprises:
placing a first active region layout pattern on a first level, the first active region layout pattern corresponding to fabricating a first active region of a first pull down transistor, the first active region layout pattern extending in a first direction;
placing a second active region layout pattern on the first level, the second active region layout pattern corresponding to fabricating a second active region of a first pass gate transistor, the second active region layout pattern extending in the first direction, and being separated from the first active region layout pattern in a second direction different from the first direction; and
placing a first metal contact layout pattern on a second level different from the first level, the first metal contact layout pattern corresponding to fabricating a first metal contact, the first metal contact layout pattern extending in the second direction, extending from the first active region layout pattern to the second active region layout pattern, and the first metal contact electrically coupling a drain of the first pull down transistor to a drain of the first pass gate transistor; and
manufacturing the memory circuit based on the layout design, the memory circuit being a four transistor (4T) memory cell including the first pass gate transistor, a second pass gate transistor, the first pull down transistor and a second pull down transistor.

11. The method of claim 10, wherein the generating the layout design further comprises:
placing a third active region layout pattern on the first level, the third active region layout pattern corresponding to fabricating a third active region of the second pull down transistor, the third active region layout pattern extending in the first direction, and being next to the first active region layout pattern; and
placing a fourth active region layout pattern on the first level, the fourth active region layout pattern corresponding to fabricating a fourth active region of the second pass gate transistor, the fourth active region layout pattern extending in the first direction, being next to the second active region layout pattern, and being separated from the third active region layout pattern in the second direction.

12. The method of claim 11, wherein the generating the layout design further comprises:
placing a second metal contact layout pattern on the second level, the second metal contact layout pattern corresponding to fabricating a second metal contact, the second metal contact layout pattern extending in the second direction, extending from the third active region layout pattern to the fourth active region layout pattern, and being located on the second level, and the second metal contact electrically coupling a drain of the second pull down transistor to a drain of the second pass gate transistor.

13. The method of claim 12, wherein the generating the layout design further comprises:

placing a third metal contact layout pattern on the second level, the third metal contact layout pattern corresponding to fabricating a third metal contact, the third metal contact layout pattern extending in the second direction, overlapping the cell boundary of the memory circuit and the first active region layout pattern, and the third metal contact electrically coupled to a source of the first pull down transistor; and
placing a fourth metal contact layout pattern on the second level, the fourth metal contact layout pattern corresponding to fabricating a fourth metal contact, the fourth metal contact layout pattern extending in the second direction, overlapping the cell boundary of the memory circuit and the third active region layout pattern, and the fourth metal contact electrically coupled to a source of the second pull down transistor.

14. The method of claim 13, wherein the generating the layout design further comprises:
placing a fifth metal contact layout pattern on the second level, the fifth metal contact layout pattern corresponding to fabricating a fifth metal contact, the fifth metal contact layout pattern extending in the second direction, being separated from the first metal contact layout pattern in the second direction, and overlapping the cell boundary of the memory circuit and the second active region layout pattern, and the fifth metal contact being electrically coupled to a source of the first pass gate transistor; and
placing a sixth metal contact layout pattern on the second level, the sixth metal contact layout pattern corresponding to fabricating a sixth metal contact, the sixth metal contact layout pattern extending in the second direction, being separated from the third metal contact layout pattern in the second direction, and overlapping the cell boundary of the memory circuit and the fourth active region layout pattern, and the sixth metal contact being electrically coupled to a source of the second pass gate transistor.

15. A memory cell comprising:
a first pull down transistor having a first active region extending in a first direction, and the first active region being located on a first level;
a first pass gate transistor having a second active region extending in the first direction, the second active region being located on the first level, and being separated from the first active region in a second direction different from the first direction;
a second pull down transistor;
a second pass gate transistor coupled to the second pull down transistor; and
a first metal contact extending in the second direction, and extending from the first active region to the second active region, the first metal contact being located on a second level different from the first level, the first metal contact electrically coupling a drain of the first pull down transistor to a drain of the first pass gate transistor; and
wherein the first pass gate transistor, the second pass gate transistor, the first pull down transistor and the second pull down transistor are part of a four transistor (4T) memory cell.

16. The memory cell of claim 15, further comprising:
a set of gates comprising:
a first gate extending in the second direction, overlapping the first active region, and being located on the second level; and a second gate extending in the second direction, overlapping the second active region being located on the second level, and being separated from the first gate in the second direction.

17. The memory cell of claim 16, further comprising:
a first set of conductive structures extending in the first direction and overlapping at least the first active region, the second active region or the set of gates, each conductive structure of the first set of conductive structures being separated from an adjacent conductive structure of the first set of conductive structures in at least the first direction or the second direction, and being located on a third level different from the first level and the second level; and
a first set of vias between the first set of conductive structures and at least the first active region, the second active region or the set of gates, the first set of vias coupling the first set of conductive structures to at least the first active region, the second active region or the set of gates; and at least one via of the first set of vias being located where at least one conductive structure of the first set of conductive structures overlaps at least one of the first active region, the second active region or the set of gates.

18. The memory cell of claim 17, further comprising:
a second set of conductive structures extending in the second direction and overlapping at least the first active region, the second active region or the first set of conductive structures, each conductive structure of the second set of conductive structures being separated from an adjacent structure of the second set of conductive structures in the first direction, and being located on a fourth level different from the first level, the second level and the third level; and
a second set of vias between the second set of conductive structures and the first set of conductive structures, the second set of vias coupling the second set of conductive structures to the first set of conductive structures, and at least one via of the second set of vias being located where at least one conductive structure of the second set of conductive structures overlaps at least one of the first set of conductive structures.

19. The memory cell of claim 18, further comprising:
a third set of conductive structures extending in the first direction and overlapping at least the second set of conductive structures, each conductive structure of the third set of conductive structures being separated from an adjacent structure of the third set of conductive structures in the second direction, and being located on a fifth level different from the first level, the second level, the third level and the fourth level; and
a third set of vias between the third set of conductive structures and the second set of conductive structures, the third set of vias coupling the third set of conductive structures to the second set of conductive structures, and at least one via of the third set of vias being located where at least one conductive structure of the third set of conductive structures overlaps at least one of the second set of conductive structures.

20. The memory cell of claim 19, wherein
the first set of vias comprises:
　a first via of the first set of vias electrically coupling the first gate to a first conductive structure of the first set of conductive structures; and
　a second via of the first set of vias electrically coupling the second gate to a second conductive structure of the first set of conductive structures; and
the second set of vias comprises:
　a first via of the second set of vias electrically coupling the second conductive structure of the first set of conductive structures to a first conductive structure of the second set of conductive structures, the first conductive structure of the second set of conductive structures corresponding to a first word line.

* * * * *